(12) United States Patent
Banerjee et al.

(10) Patent No.: US 11,705,890 B2
(45) Date of Patent: Jul. 18, 2023

(54) PROGRAMMABLE ANALOG CALIBRATION CIRCUIT SUPPORTING ITERATIVE MEASUREMENT OF AN INPUT SIGNAL FROM A MEASURED CIRCUIT, SUCH AS FOR CALIBRATION, AND RELATED METHODS

(71) Applicant: Microsoft Technology Licensing, LLC, Redmond, WA (US)

(72) Inventors: Anirban Banerjee, Cary, NC (US); Bupesh Pandita, Cary, NC (US); Charles Boecker, Ames, IA (US); Eric Groen, Ankeny, IA (US)

(73) Assignee: Microsoft Technology Licensing, LLC, Redmond, WA (US)

( * ) Notice: Subject to any disclaimer, the term of this patent is extended or adjusted under 35 U.S.C. 154(b) by 21 days.

(21) Appl. No.: 17/412,879

(22) Filed: Aug. 26, 2021

(65) Prior Publication Data
US 2023/0060647 A1    Mar. 2, 2023

(51) Int. Cl.
*H03K 3/011*    (2006.01)
*H03K 3/017*    (2006.01)
(Continued)

(52) U.S. Cl.
CPC ............... *H03K 3/011* (2013.01); *G06F 1/06* (2013.01); *H03K 3/017* (2013.01); *H03K 5/24* (2013.01)

(58) Field of Classification Search
CPC .......... H03M 1/12; H03M 1/66; H03M 1/365; H03M 1/1023; H03M 1/1009; H03M 9/00;
(Continued)

(56) References Cited

U.S. PATENT DOCUMENTS 5,696,508 A * 12/1997 Gross, Jr. ............ H03M 1/1023
341/118
7,283,082 B1    10/2007 Kuyel
(Continued)

FOREIGN PATENT DOCUMENTS

JP    S58103226 A    6/1983

OTHER PUBLICATIONS

"International Search Report Written Opinion Issued in PCT Application No. PCT/US22/035636", dated Oct. 21, 2022, 15 Pages. (MS#410354-WO-PCT).

*Primary Examiner* — John W Poos
(74) *Attorney, Agent, or Firm* — Withrow & Terranova, PLLC

(57) ABSTRACT

Analog calibration (ACAL) circuits supporting iterative measurement of an input signal from a measured circuit, and related methods are disclosed. The ACAL circuit includes a voltage reference generation circuit and a comparator circuit. The voltage reference generation circuit is configured to provide an input reference voltage. The comparator circuit is configured to compare the input reference voltage to an input circuit voltage of a measured circuit and generate a digital measurement signal based on the comparison. To provide for the ACAL circuit to more precisely measure the input circuit voltage, the voltage reference generation circuit is programmable and is configured to a generate the input reference voltage based on a programmed reference voltage selection. In this manner, the ACAL circuit can be used to measure the input circuit voltage in an iterative manner based on different programmed input reference voltages for a more precise measurement of the input circuit voltage.

34 Claims, 6 Drawing Sheets

Figure 1:
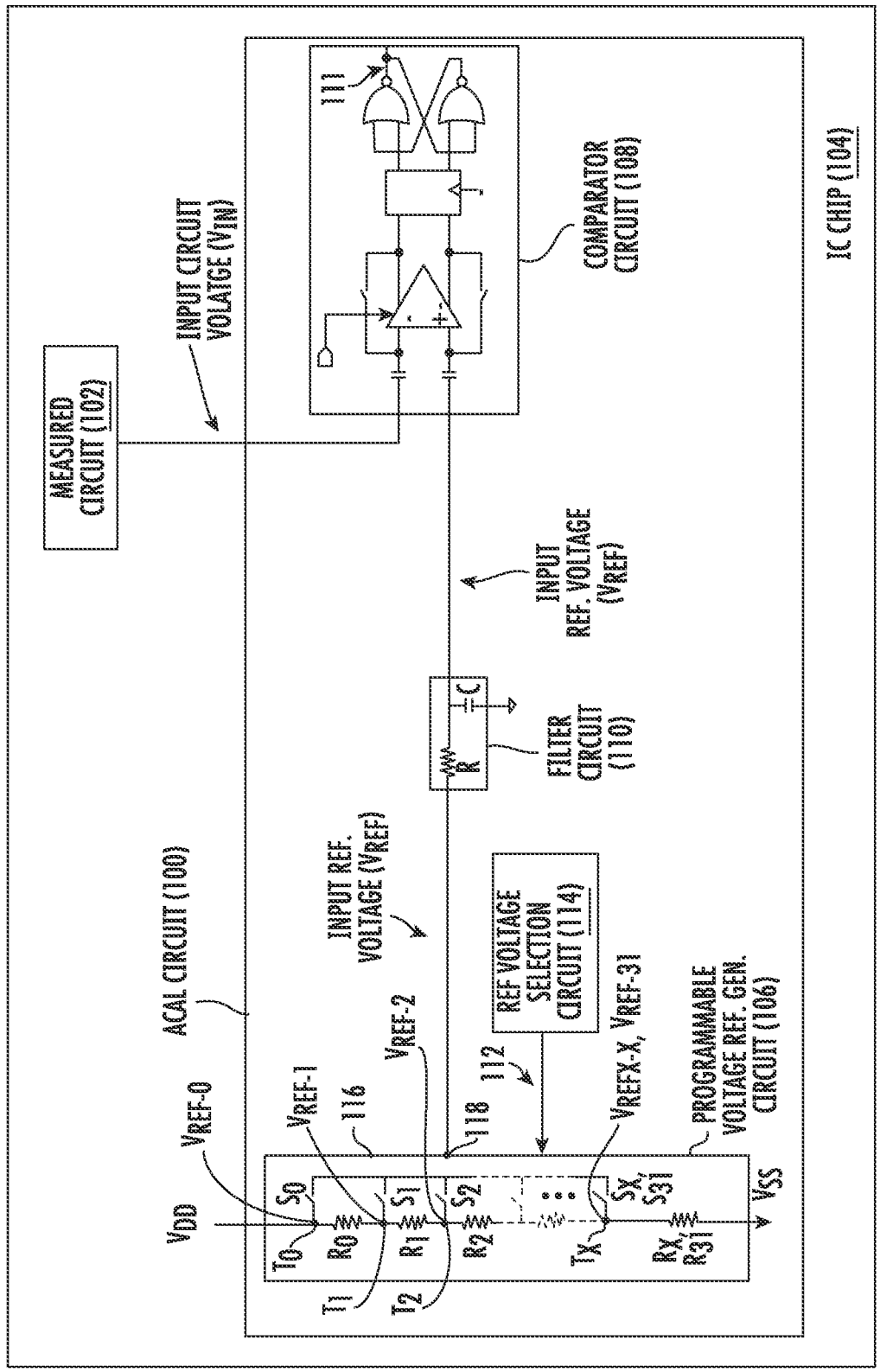

(51) Int. Cl.
*H03K 5/24* (2006.01)
*G06F 1/06* (2006.01)

(58) Field of Classification Search
CPC ...... H03M 1/1245; H03L 7/099; H03L 7/093;
H03L 7/08; H03L 7/18; H03K 5/24;
H03K 5/135; H03K 3/0315; H03K 5/133;
H03K 5/1565; G01R 35/005; G01R
31/31725; G01R 31/31709; G01R
31/31703
See application file for complete search history.

(56) References Cited

U.S. PATENT DOCUMENTS

| | | | | |
|---|---|---|---|---|
| 2002/0149507 | A1* | 10/2002 | Kaul | H03M 1/1014 |
| | | | | 341/139 |
| 2008/0158037 | A1* | 7/2008 | Hsien | H03M 1/1061 |
| | | | | 341/164 |
| 2013/0082852 | A1 | 4/2013 | Coban | |
| 2017/0261537 | A1* | 9/2017 | Chong | G01R 31/3004 |

\* cited by examiner

| MODE 402 | CONFIGMUX[3:0] 377 | SEL_VDDREF | INP0 380(0) | INN0 380(1) | REFP0 380(2) | REFN0 380(3) |
|---|---|---|---|---|---|---|
| 1 | 4'b0000 | 1'b0 | $V_{INP}$ | $V_{REF}$ | $V_{REF}$ | $V_{INP}$ |
| 2 | 4'b0001 | 1'b0 | $V_{INP}$ | $V_{INN}$ | $V_{REF}$ | 0 |
| 3 | 4'b0010 | 1'b1 | $V_{REF1}$ | $V_{REF}*$ | $V_{REF}*$ | $V_{REF1}$ |
| 4 | 4'b0011 | 1'b1 | $V_{REF0}$ | $V_{REF}*$ | $V_{REF}*$ | $V_{REF0}$ |
| 5 | 4'b0100 | 1'b0 | $V_{INP}$ | $V_{INN}$ | $V_{INN}$ | $V_{INP}$ |

$V_{REF}*$ = REFERENCE VOLTAGE INTERPOLATED BETWEEN $V_{DD}$ AND $V_{SS}$

FIG. 4A

450(1) — MODE#1: SINGLE ENDED VOLTAGE
$(V_{INP} - V_{REF}) - (V_{REF} - V_{INP}) >= 0$ ?

450(2) — MODE#2: DIFFERENTIAL VOLTAGE
$(V_{INP} - V_{REF}) - (V_{INN} - 0) >= 0$ ?

450(3) — MODE#3: SAME AS MODE#1, EXCEPT
$V_{REF}* =>$ INTERPOLATED BETWEEN $V_{DD}$ AND $V_{SS}$ (SEL_VDDREF=1)
$(V_{REF1} - V_{REF}*) - (V_{REF}* - V_{REF1}) >= 0$ ?

450(4) — MODE#4: SAME AS MODE#3, EXCEPT
$V_{REF}* =>$ INTERPOLATED BETWEEN VDDA AND VSSA (SEL_VDDREF=1)
$(V_{REF0} - V_{REF}*) - (V_{REF}* - V_{REF0}) >= 0$ ?

450(5) — MODE#5: DIFFERENTIAL VOLTAGE WITH NO REFERENCE
$(V_{INP} - V_{INN}) - (V_{INN} - V_{INP}) >= 0$ ?

FIG. 4B

PROGRAMMABLE ANALOG CALIBRATION CIRCUIT SUPPORTING ITERATIVE MEASUREMENT OF AN INPUT SIGNAL FROM A MEASURED CIRCUIT, SUCH AS FOR CALIBRATION, AND RELATED METHODS

FIELD OF THE DISCLOSURE

The technology of the disclosure relates to analog calibration (ACAL) circuits, and more particularly to ACAL circuits that can be located on-chip with a processor, including in a system-on-a-chip (SoC), to provide precise voltage measurements to be used for calibration of circuits in the processor.

BACKGROUND

An analog calibration (ACAL) circuit, also referred to as "analog calibration engine," is a general-purpose custom analog circuit employed for on-chip precision voltage measurements. As an example, an ACAL circuit can be employed on-chip with a high-speed serializer/deserializer (SerDes) circuit system to provide on-chip measurement signals used for calibration of the SerDes circuit. The on-chip ACAL circuit can be employed to support a variety of circuit calibrations. For example, it may be desired or necessary to make calibrations to circuits during their operation, such as due to process, voltage, and/or temperature (PVT) variations, for the intended operation and performance of such circuits. As one example, an ACAL circuit can be employed in an analog-to-digital converter (ADC) high-speed receiver in a SerDes system to provide a reference voltage that can be used for ADC offset calibration. In another example, an ACAL circuit can be employed in a high-speed transmitter to calibrate output driver resistance and adjustment of clock duty cycle. In yet another example, an ACAL circuit can also be employed to generate precise on-chip bias voltages and/or current measurements that can be used for calibrations and/or operations of circuits.

In high-speed SerDes circuit design, conventional techniques have been implemented for on-chip circuit calibrations. However, these conventional techniques have known issues. For example, an ACAL circuit macro may consume a large die area of the integrated circuit (IC) chip where it would be difficult or not feasible to provide for multiple instances of the ACAL circuit macro on the chip. Thus, output signals from circuits systems to be calibrated must be routed to a smaller number of ACAL circuits or central ACAL circuit for the ACAL circuit(s) to generate on-chip measurement signals for calibration, thus increasing the routing complexity and signal routing delay for calibrating circuits. Further, providing a smaller number of ACAL circuits or central ACAL circuit means that the ACAL circuit may have to be designed to be able to generate multiple on-chip measurement signals to support a plurality of other on-chip circuits, thus increasing the size and power consumption of the ACAL circuit(s). For example, in a high-speed SerDes circuit, it may be necessary or desired for performance reasons to provide an ACAL circuit that can generate on-chip measurement signals for each lane of the SerDes circuit. As the overall footprint and number of lanes of the SerDes circuit in a chip increase over design cycles, such as due to the advancement in the reduction of process node size, the ACAL circuit(s) that support calibration of the SerDes circuit will likely increase in footprint on the chip.

SUMMARY

Exemplary aspects disclosed herein include programmable analog calibration (ACAL) circuits supporting iterative measurement of an input signal from a measured circuit. Related methods are also disclosed. As one non-limiting example, the ACAL circuit can be employed in the same integrated circuit (IC) chip that contains the measured circuit to provide on-chip measurement of the measured circuit for calibration purposes. For example, the measured circuit may be a serializer/deserializer (SerDes) circuit in an IC chip. In exemplary aspects, the ACAL circuit includes a voltage reference generation circuit and a comparator circuit. The voltage reference generation circuit is configured to provide an input reference voltage to the comparator circuit. The comparator circuit is configured to compare the input reference voltage to an input circuit voltage from a measured circuit (e.g., from a circuit to be calibrated) and generate a digital measurement signal (e.g., a logic '0' or logic '1') based on the comparison. The comparator circuit operates like an analog-to-digital converter (ADC) circuit. For example, if the input circuit voltage is higher than the input reference voltage, the comparator circuit may be configured to generate the digital measurement signal as a digital logic '0' value. If the input circuit voltage is lower than the input reference voltage, the comparator circuit may be configured to generate a digital logic '1' value as the digital measurement signal. In this manner, digital measurement signal is an indicator of the voltage level of the input circuit voltage.

In exemplary aspects, to provide for the ability of the ACAL circuit to more precisely measure the input circuit voltage, the ACAL circuit includes a programmable voltage reference generation circuit as the voltage reference generation circuit. The programmable voltage reference generation circuit can operate similarly to a digital-to-analog converter (DAC) circuit. For example, the programmable voltage reference generation circuit may be a resister ladder circuit that includes a plurality of series-connected resistors providing a plurality of tap nodes with different step reference voltages based on progressive voltage drops across the resistors. The programmable voltage reference generation circuit is configured to a provide a programmed step reference voltage(s) of a particular selected step reference voltage based on a reference voltage programming selection generated by a reference voltage selection circuit. The input reference voltage provided to the comparator circuit is based on at the programmed step reference voltage(s). By the programmable voltage reference generation circuit being able to programmably generate the step reference voltage(s) of a desired step voltage level, the ACAL circuit can be used to measure the input circuit voltage in an iterative manner for a more precise measurement of the input circuit voltage. Based on the digital measurement signal generated by the comparator circuit in a given operation iteration of the ACAL circuit, the programmable voltage reference generation circuit can be programmed to generate the step reference voltage(s) of a next selected step reference voltage in a subsequent operation iteration to then be compared again to the input circuit voltage by the comparator circuit. This programmable voltage reference generation circuit in the ACAL circuit can be iteratively programmed until the comparator circuit determines that the input circuit voltage corresponds to the programmed input reference voltage.

In another exemplary aspect, a filter circuit (e.g., a low pass filter circuit) is provided in the ACAL circuit and coupled between the programmable voltage reference generation circuit and the comparator circuit. The filter circuit is configured to filter out noise and/or ripples in the input reference voltage generated by the programmable voltage reference generation circuit to provide a more stable input reference voltage to the comparator circuit for a more precise measurement. Also, by the programmable voltage reference generation circuit being configured to generate the step reference voltage(s) used to generate the input reference voltage provided to the comparator circuit, the components (e.g., resistor(s) and capacitor(s)) of the filter circuit can be sized smaller of a smaller resistance and capacitance to adequately filter the input reference voltage. A filter circuit often consumes a larger or the largest area in an IC chip within the ACAL circuit because of the nature in which filter components are fabricated in the IC chip. A reduced size filter circuit may allow larger number of ACAL circuits to be included in the IC chip and/or located in closer proximity on the die of the IC chip to the circuits to be calibrated by the respective ACAL circuits. Thus, a larger number of reduced-footprint ACAL circuits may be able be placed in closer physical proximity to circuits to be calibrated. In this manner, routing delay between the on-chip ACAL circuits and their respective calibrated on-chip circuits can be reduced to mitigate any reduction in performance due to calibration delay. Also, providing a larger number of smaller footprint on-chip ACAL circuits that are more dedicated to particular circuits on the chip may reduce the overall power consumption by the ACAL circuits.

Further, in another exemplary aspect, the programmable voltage reference generation circuit can include an optional multiplexor circuit that is configured to receive and mix the programmed differential step reference voltages to generate an interpolated input reference voltage to be provided to the comparator circuit. Mixing the differential step reference voltages can further reduce noise and/or ripple in the input reference voltage. This may allow the comparator circuit to perform a more precise comparison of the input circuit voltage to the input reference voltage, and thus a more precise measurement of the input circuit voltage.

Further, in another exemplary aspect, the programmable voltage reference generation circuit can include an optional delta-sigma modulator circuit. The delta-sigma modulator circuit is configured to generate a pulsed signal at a programmed duty cycle according to an input duty cycle selection to control the output selection of the multiplexer circuit. The duty cycle of the pulsed signal controls the weighted mixing (i.e., interpolation) of the differential step reference voltages to be able to generate an even higher resolution input reference voltage to allow the comparator circuit to even more precisely measure the input circuit voltage.

Further, in another exemplary aspect, the ACAL circuit includes a measurement mode selector circuit that is coupled between the programmable voltage reference generation circuit and the comparator circuit. The measurement mode selector circuit is configured to receive the direct step reference voltage(s) programmably selected by the programmable voltage reference generation circuit as input voltages, the input reference voltage generated by the programmable voltage reference generation circuit, and one or more input circuit voltages. Based on a measurement mode input, the mode selector circuit is configured to pass these input voltages to the comparator circuit based on the desired measurement mode desired to be performed by the comparator circuit. For example, the measurement mode selector circuit can be configured to cause the comparator circuit to perform a single ended voltage measurement, a differential voltage with reference voltage measurement, a differential voltage without reference voltage measurement, and/or a test voltage measurement (e.g., to determine the offset in the comparator circuit).

In this regard, in one exemplary aspect, an ACAL circuit is provided. The ACAL circuit includes a programmable voltage reference generation circuit configured to generate a step reference voltage among a plurality of programmable step reference voltages based on a supply voltage and a reference voltage programming selection selected by a reference voltage selection circuit. The ACAL circuit is configured to generate an input reference voltage based on the selected step reference voltage. The ACAL circuit further comprises a comparator circuit. The comparator circuit is configured to compare the input reference voltage to an input circuit voltage from a measured circuit and generate a digital measurement signal based on a difference between the input reference voltage and the input circuit voltage In another exemplary aspect, a method of measuring an input circuit voltage of a measured circuit. The method comprises setting a reference voltage programming selection to select a step reference voltage among a plurality of programmable step reference voltages. The method also comprises, in response to setting the reference voltage programming selection: generating a step reference voltage among the plurality of programmable step reference voltages based on a supply voltage and the reference voltage programming selection, generating an input reference voltage based on the selected step reference voltage, comparing the input reference voltage to an input circuit voltage from a measured circuit, and generating a digital measurement signal based on a difference between the input reference voltage and the input circuit voltage.

Those skilled in the art will appreciate the scope of the present disclosure and realize additional aspects thereof after reading the following detailed description of the preferred embodiments in association with the accompanying drawing figures.

BRIEF DESCRIPTION OF THE DRAWING FIGURES

The accompanying drawing figures incorporated in and forming a part of this specification illustrate several aspects of the disclosure, and together with the description serve to explain the principles of the disclosure.

Figure 2:
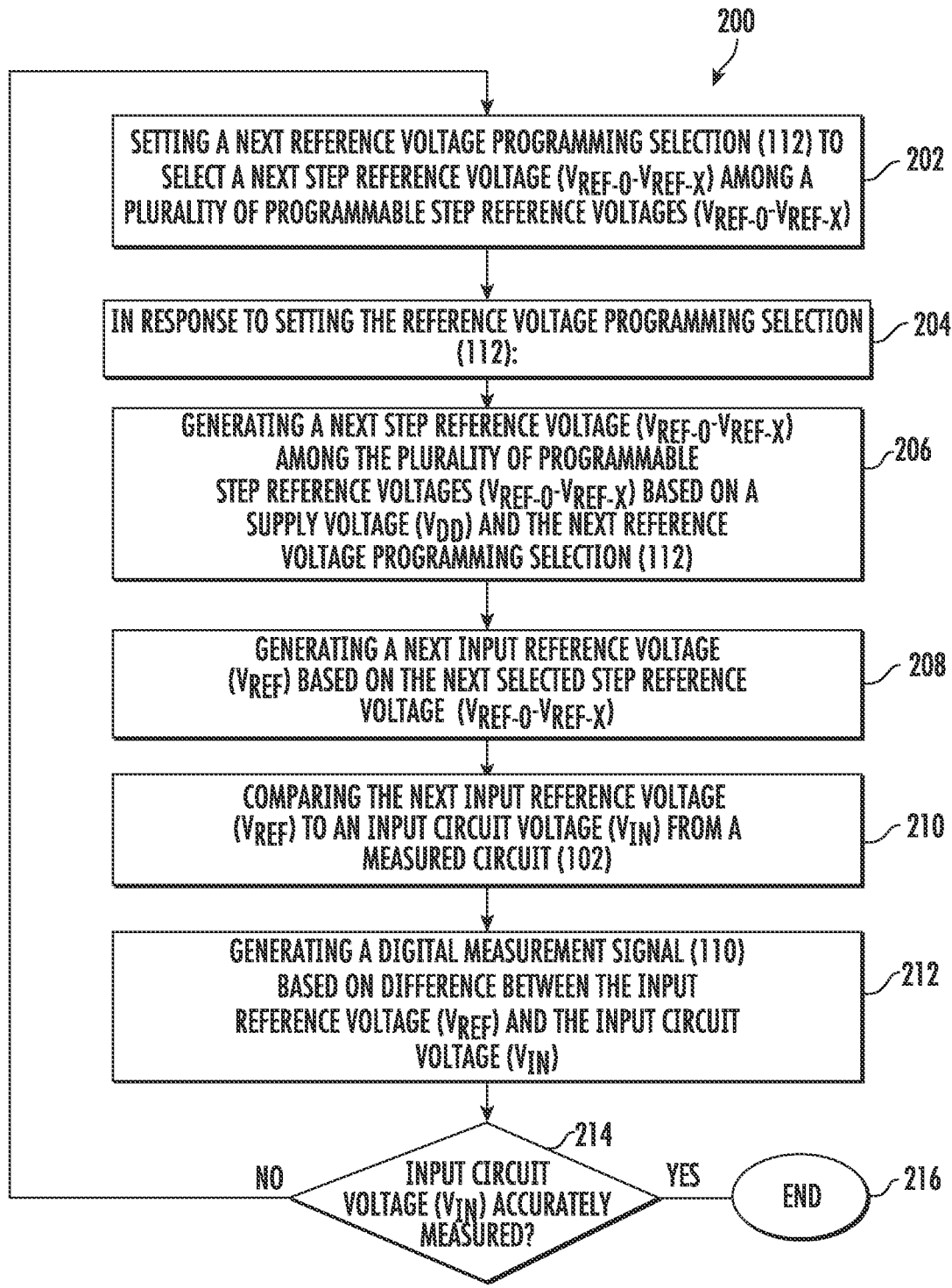
Figure 3A:
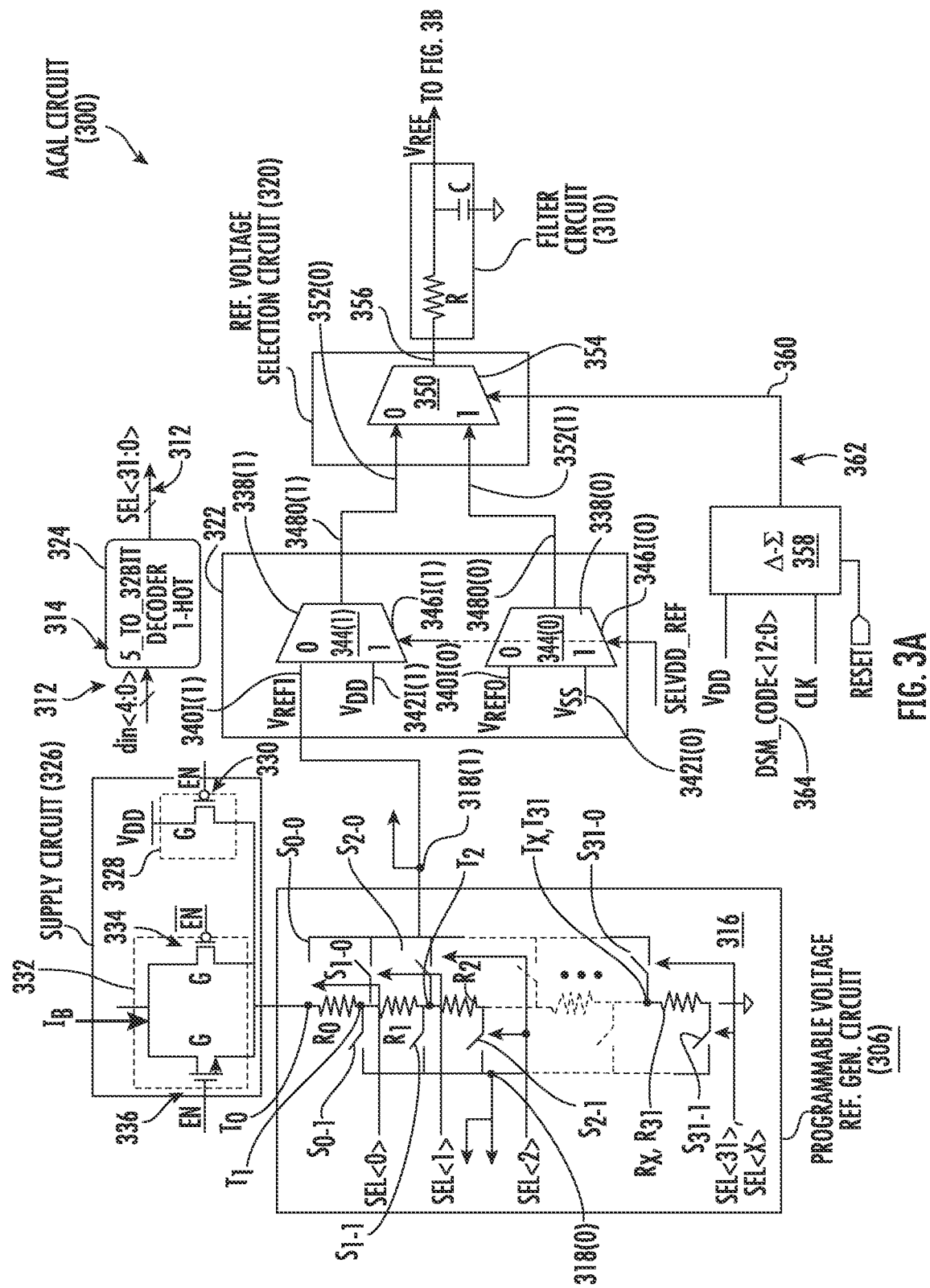
Figure 3B:
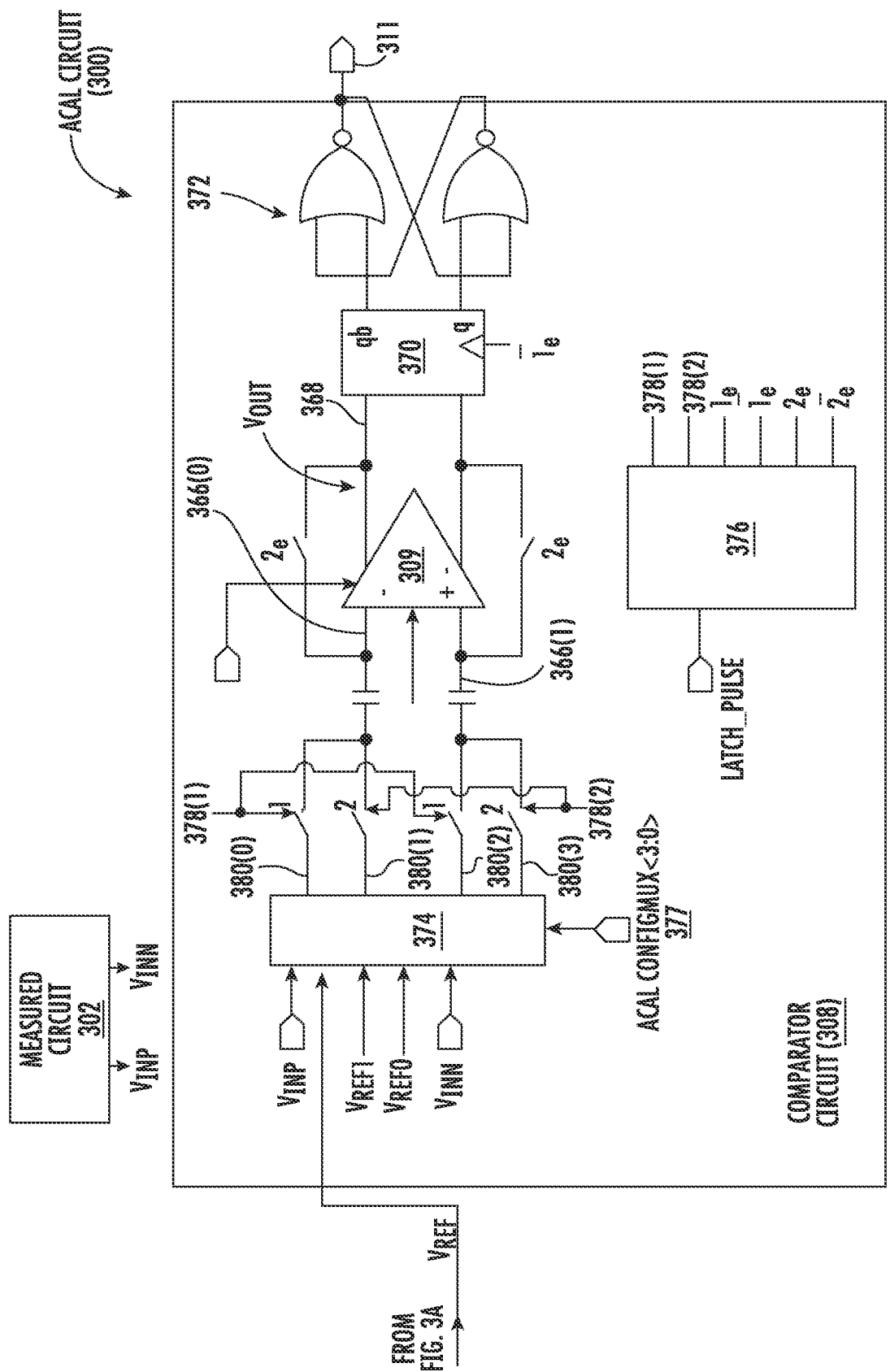
Figure 5:
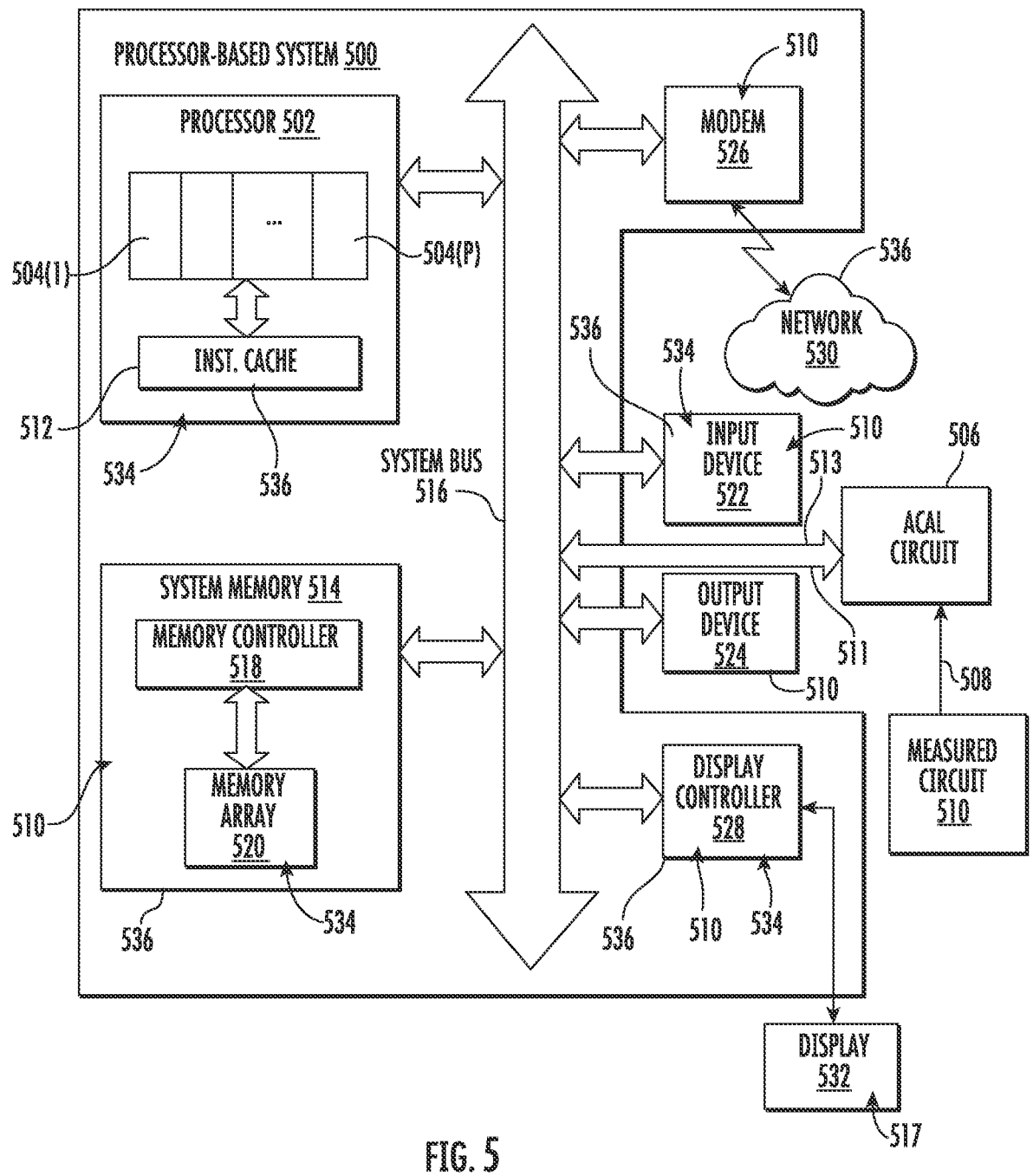

FIG. 1 is a block diagram of an exemplary analog calibration (ACAL) circuit that includes a programmable voltage reference generation circuit configured to provide an input reference voltage based on programmed step reference voltage(s) to a comparator circuit to be used to measure an input circuit voltage from a measured circuit, wherein the programmable voltage reference generation circuit supports programming of different step reference voltage(s) in an iterative manner to more precisely measure the input circuit voltage;

FIG. 2 is a flowchart illustrating an exemplary process of the ACAL circuit in FIG. 1 iteratively measuring an input circuit voltage from a measured circuit based on successive selections of programmed step reference voltage(s) to be generated by the programmable voltage reference generation circuit;

FIGS. 3A and 3B is a circuit diagram of another exemplary ACAL circuit that includes a programmable voltage reference generation circuit configured to provide an input reference voltage based on programmed step reference voltage(s) to a comparator circuit to be used to measure an input circuit voltage from a measured circuit, wherein the programmable voltage reference generation circuit supports programming of different step reference voltage(s) in an iterative manner to more precisely measure the input circuit voltage;

FIG. 4A is a chart illustrating different measurement modes of operation of the ACAL circuit in FIGS. 3A and 3B based on programmable selections for the ACAL circuit;

FIG. 4B is a series of equations illustrating the mode of operation of the ACAL circuit in FIGS. 3A and 3B for each of the measurement modes in the chart in FIG. 4A; and FIG. 5 is a block diagram of an exemplary processor-based system that can be provided in an integrated circuit (IC) chip, wherein the processor-based system includes a processor with one or more processor cores each configured to execute computer instructions for execution, and one or more ACAL circuits with a programmable voltage reference generation circuit supports programming of different step reference voltage(s) in an iterative manner to more precisely measure the input circuit voltage, including, without limitation, the ACAL circuits in FIGS. 1 and 3A-3B.

DETAILED DESCRIPTION

Exemplary aspects disclosed herein include programmable analog calibration (ACAL) circuits supporting iterative measurement of an input signal from a measured circuit. Related methods are also disclosed. As one non-limiting example, the ACAL circuit can be employed in the same integrated circuit (IC) chip that contains the measured circuit to provide on-chip measurement of the measured circuit for calibration purposes. For example, the measured circuit may be a serializer/deserializer (SerDes) circuit in an IC chip. In exemplary aspects, the ACAL circuit includes a voltage reference generation circuit and a comparator circuit. The voltage reference generation circuit is configured to provide an input reference voltage to the comparator circuit. The comparator circuit is configured to compare the input reference voltage to an input circuit voltage from a measured circuit (e.g., from a circuit to be calibrated) and generate a digital measurement signal (e.g., a logic '0' or logic '1') based on the comparison. The comparator circuit operates like an analog-to-digital converter (ADC) circuit. For example, if the input circuit voltage is higher than the input reference voltage, the comparator circuit may be configured to generate the digital measurement signal as a digital logic '0' value. If the input circuit voltage is lower than the input reference voltage, the comparator circuit may be configured to generate the digital measurement signal as a digital logic '1' value. In this manner, digital measurement signal is an indicator of the voltage level of the input circuit voltage.

In exemplary aspects, to provide for the ability of the ACAL circuit to more precisely measure the input circuit voltage, the ACAL circuit includes a programmable voltage reference generation circuit as the voltage reference generation circuit. The programmable voltage reference generation circuit can operate similarly to a digital-to-analog converter (DAC) circuit. For example, the programmable voltage reference generation circuit may be a resister ladder circuit that includes a plurality of series-connected resistors providing a plurality of tap nodes with different step reference voltages based on progressive voltage drops across the resistors. The programmable voltage reference generation circuit is configured to a provide a programmed step reference voltage(s) of a particular selected step reference voltage based on a reference voltage programming selection generated by a reference voltage selection circuit. The input reference voltage provided to the comparator circuit is based on at the programmed step reference voltage(s). By the programmable voltage reference generation circuit being able to programmably generate the step reference voltage(s) of a desired step voltage level, the ACAL circuit can be used to measure the input circuit voltage in an iterative manner for a more precise measurement of the input circuit voltage. Based on the digital measurement signal generated by the comparator circuit in a given operation iteration of the ACAL circuit, the programmable voltage reference generation circuit can be programmed to generate the step reference voltage(s) of a next selected step reference voltage in a subsequent operation iteration to then be compared again to the input circuit voltage by the comparator circuit. This programmable voltage reference generation circuit in the ACAL circuit can be iteratively programmed until the comparator circuit determines that the input circuit voltage corresponds to the programmed input reference voltage.

In this regard, FIG. 1 is a block diagram of an exemplary ACAL circuit 100 that is configured to measure an input circuit voltage $V_{IN}$ from a measured circuit 102. The ACAL circuit 100 can be included in the same IC chip 104 that contains the measured circuit 102 to provide on-chip measurement of the measured circuit 102, such as for calibration purposes. For example, the measured circuit 102 may be a SerDes circuit in the IC chip 104. The ACAL circuit 100 includes a programmable voltage reference generation circuit 106 and a comparator circuit 108. For example, the comparator circuit 108 can be an operational amplifier (op-amp). The programmable voltage reference generation circuit 106 is configured to provide an input reference voltage $V_{REF}$ to the comparator circuit 108. A filter circuit 110 (e.g., a resistor R coupled to a capacitor C coupled to ground) is coupled inline between the programmable voltage reference generation circuit 106 and the comparator circuit 108 to filter out noise and/or other frequency components of the input reference voltage $V_{REF}$. The comparator circuit 108 is configured to compare the input reference voltage $V_{REF}$ to the input circuit voltage $V_{IN}$ from the measured circuit 102 (e.g., from a circuit to be calibrated) and generate a digital measurement signal 111 (e.g., a logic '0' or logic '1') based on the comparison. The comparator circuit 108 operates like an ADC circuit. For example, if the input circuit voltage $V_{IN}$ is higher than the input reference voltage $V_{REF}$, the comparator circuit 108 may be configured to generate the digital measurement signal 111 as a digital logic '0' value. However, if the input circuit voltage $V_{IN}$ is lower than the input reference voltage $V_{REF}$, the comparator circuit 108 may be configured to generate the digital measurement signal 111 as a digital logic '1' value. In this manner, digital measurement signal 111 is an indicator of the voltage level of the input circuit voltage $V_{IN}$ of the measured circuit 102 relative to the input reference voltage $V_{REF}$.

To provide for the ability of the ACAL circuit 100 in FIG. 1 to more precisely measure the input circuit voltage $V_{IN}$ from the measured circuit 102, the programmable voltage reference generation circuit 106 is programmable to generate the input reference voltage $V_{REF}$ at a desired voltage level. This is opposed to providing, for example, a higher level positive supply voltage ("supply voltage") $V_{DD}$ of the IC chip 104 as the input reference voltage $V_{REF}$. The closer the input reference voltage $V_{REF}$ is to the actual voltage level of the input circuit voltage $V_{IN}$, the more accurate the input circuit voltage $V_{IN}$ can be measured. As discussed in more detail below, the programmable voltage reference generation circuit 106 is configured to a provide a programmed input reference voltage $V_{REF}$ of a particular selected step reference voltage based on a reference voltage programming selection 112 generated by a reference voltage selection circuit 114. For example, the programmable voltage reference generation circuit 106 may be capable of generating the input reference voltage $V_{REF}$ in 25 milliVolt (mV) steps. The input reference voltage $V_{REF}$ at a given step reference voltage provided to the comparator circuit 108 is based on the reference voltage programming selection 112. By the programmable voltage reference generation circuit 106 being able to programmably generate the input reference voltage $V_{REF}$ of a desired step reference voltage, the ACAL circuit 100 can be used to measure the input circuit voltage $V_{IN}$ in an iterative manner for a more precise measurement of the input circuit voltage $V_{IN}$. Based on the digital measurement signal 111 generated by the comparator circuit 108 in a given operation iteration of the ACAL circuit 100, the programmable voltage reference generation circuit 106 can be reprogrammed in an iterative manner to generate a next step reference voltage as the input reference voltage $V_{REF}$ in a subsequent operation iteration to then be compared again to the input circuit voltage $V_{DD}$ by the comparator circuit 108. This programmable voltage reference generation circuit 106 can continue to be iteratively programmed to generate subsequent, next input reference voltages $V_{REF}$ at next voltage steps until the comparator circuit 108 generates a digital measurement signal 111 as the input circuit voltage $V_A$ corresponding (i.e., matching or being the closest match) to a given programmed input circuit voltage $V_{IN}$ programmed by the reference voltage selection circuit 114.

In this example of the ACAL circuit 100 in FIG. 1, the programmable voltage reference generation circuit 106 is provided in the form of a resistor ladder circuit 116. The resistor ladder circuit 116 includes a plurality of series-connected resistors $R_0$-$R_X$, with resistor $R_0$ coupled to the positive supply voltage $V_{DD}$ and the last resistor Rx coupled to a ground voltage $V_{SS}$. Tap nodes $T_0$-$T_X$ are formed between adjacent coupled resistors $R_0$-$R_X$. The resistor ladder circuit 116 is a voltage divider circuit where the positive supply voltage $V_DD$ is divided across each resistor $R_0$-$R_X$ into 'X' reference step voltages $V_{REF-0}$-$V_{REF-X}$. For example, if 'X' in $R_X$ is equal to thirty-two (31), there would be a total of thirty-two (32) resistors as $R_0$-$R_{31}$. If each of the resistors $R_0$-$R_X$, $R_{31}$ have the same resistance, the positive supply voltage $V_{DD}$ will be split into thirty-two (32) even reference voltage steps of reference step voltages $V_{REF-0}$-$V_{REF-X}$, $V_{REF-31}$ present at each tap node $T_0$-$T_X$, $T_{31}$. For example, if positive supply voltage $V_{DD}$ is 0.8 Volts, the voltage steps generated at each tap node $T_0$-$T_3$, would be 0.8 Volts/32 steps=approximately 25 mV steps. Switches $S_0$-$S_X$ are coupled to each of the resistors $R_0$-$R_X$ that control the coupling of the respective tap nodes $T_0$-$T_X$ to a resistor ladder output 118 that is coupled to the filter circuit 110 and indirectly to the comparator circuit 108. So in this example, the reference voltage programming selection 112 controls which switch $S_0$-$S_X$ is closed by the programmable voltage reference generation circuit 106 to couple the respective selected tap node $T_0$-$T_X$ to the resistor ladder output 118 to provide the programmed step reference voltage $V_{REF-0}$-$V_{REF-X}$ as the input reference voltage $V_{REF}$. The programmable voltage reference generation circuit 106 behaves like a DAC circuit where the reference voltage selection circuit 114 is a decoder, for example, that accepts a digital word input and activates a single output as the "hot" output to activate a switches $S_0$-$S_X$ according to the digital word input.

Thus, by programming the programmable voltage reference generation circuit 106 through the reference voltage programming selection 112, the programmable voltage reference generation circuit 106 can be controlled to provide and change the input reference voltage $V_{REF}$ provided to the comparator circuit 108 to be compared to the input circuit voltage $V_{IN}$ in an iterative manner until the input circuit voltage $V_{IN}$ is accurately measured based on the known programmed step reference voltage $V_{REF-0}$-$V_{REF-X}$ as the input reference voltage $V_{REF}$. As an example, a hardware, firmware, or software state machine can be provided in the IC chip 104 to drive the iterative programming of the programmable voltage reference generation circuit 106 to cause the ACAL circuit 100 to measure the input circuit voltage $V_{IN}$. As another example, the ACAL circuit 100 can be employed to allow voltages to be set and adjusted in post-production of the IC chip 104 when the IC chip 104 is operational. In this manner, the IC chip 104 has the flexibility of allowing voltages to be measured and changed to adjust operation of the IC chip 104 and/or to compensate for process, voltage, temperature (PVT) variations.

FIG. 2 is a flowchart illustrating an exemplary process 200 of the ACAL circuit 100 in FIG. 1 iteratively measuring the input circuit voltage $V_{IN}$ from the measured circuit 102 based on successive selections of programmed step reference voltage(s) to be generated by the programmable voltage reference generation circuit 106. In this regard, as illustrated in FIG. 2, a first step in the process 200 of measuring the input circuit voltage $V_{IN}$ from the measured circuit 102 in this example involves setting a next reference voltage programming selection 112 to select a next step reference voltage $V_{RFF-0}$-$V_{RFF-X}$ among a plurality of programmable step reference voltages $V_{REF-0}$-$V_{REF-X}$ (block 202 in FIG. 2). The next reference voltage programming selection 112 could be a first reference voltage programming selection 112 based on an initial iteration of measuring the input circuit voltage $V_{IN}$, or a subsequent reference voltage programming selection 112 in a subsequent iteration of measuring the input circuit voltage $V_{IN}$ before the input circuit voltage $V_{IN}$ has been accurately measured. In response to setting the reference voltage programming selection 112 (block 204 in FIG. 2), a next step in the process 200 includes the reference voltage programming selection 112 generating a next step reference voltage $V_{REF-0}$-$V_{REF-X}$ among the plurality of programmable step reference voltages $V_{REF-0}$-$V_{REF-X}$ in the programmable voltage reference generation circuit 106 based on the positive supply voltage $V_{DD}$ and the next reference voltage programming selection 112 (block 206 in FIG. 2). The reference voltage programming selection 112 generates a next input reference voltage $V_{REF}$ based on the next selected step reference voltage $V_{REF-0}$-$V_{REF-X}$ (block 208 in FIG. 2).

With continued reference to FIG. 2, a next step in the process 200 includes the comparator circuit 108 comparing the next input reference voltage $V_{REF}$ generated by programmable voltage reference generation circuit 106 to the input circuit voltage $V_{DD}$ from the measured circuit 102 (block 210 in FIG. 2). The comparator circuit 108 generates a digital measurement signal 111 based on the difference between the input reference voltage $V_{REF}$ and the input circuit voltage VI. (block 212 in FIG. 2). If the input circuit voltage $V_{IN}$ is not yet accurately measured (block 214 in FIG. 2), the process repeats by returning to step 202 to set a next step reference voltage $V_{REF-0}$-$V_{REF-X}$ for the programmable voltage reference generation circuit 106 to use to generate the input reference voltage $V_{REF}$. However, if the input circuit voltage $V_{IN}$ is accurately measured (block 214 in FIG. 2), the process ends (block 216 in FIG. 2). As an example, it can be determined if the input circuit voltage $V_{IN}$ is accurately measured if the input circuit voltage $V_{IN}$ is determined based on the digital measurement signal 111 generated by the comparator circuit 108 to be a voltage between the current and last input circuit voltage $V_{IN}$ generated by the programmable voltage reference generation circuit 106.

FIGS. 3A and 3B illustrate another example of a ACAL circuit 300 that is configured to measure either a positive input circuit voltage $V_{INP}$ or negative input circuit voltage $V_{INN}$ (see FIG. 3B) from a measured circuit. Like the ACAL circuit 100 in FIG. 1, the ACAL circuit 300 in FIGS. 3A and 3B can be included in the same IC chip that contains a measured circuit that has the positive and negative input circuit voltages $V_{INP}$, $V_{INN}$ to provide on-chip measurement of the measured circuit, such as for calibration purposes. Like the ACAL circuit 100 in FIG. 1, the ACAL circuit 300 in FIGS. 3A and 3B also includes a programmable voltage reference generation circuit 306 (FIG. 3A) and a comparator circuit 308 (FIG. 3B). For example, the comparator circuit 308 can include op-amp 309. The programmable voltage reference generation circuit 306 is configured to provide differential input reference voltages $V_{REF0}$, $V_{REF1}$ to the comparator circuit 308. As discussed in more detail below, the differential input reference voltages $V_{REF0}$, $V_{REF1}$ are different step reference voltages on tap nodes on each side of a selected resistor in a resistor ladder circuit 316 in the programmable voltage reference generation circuit 306. As will also be discussed in more detail below, the ACAL circuit 300 also includes a reference voltage selection circuit 320 that is configured to pass a selected reference voltage to the comparator circuit 308 to be used to measure an input circuit voltage $V_{INP}$, $V_{INN}$. This is provided for the flexibility of selecting the desired input reference voltage to be used to compare to input circuit voltage $V_{INP}$, $V_{INN}$ based on a desired operational mode, which is discussed in more detail below. As will also be discussed in more detail below, the ACAL circuit 300 also includes pre-reference voltage selection circuit 322 that is configured to select between the respective differential input reference voltages $V_{REF0}$, $V_{REF1}$ and the positive supply and ground voltages $V_{DD}$, $V_{SS}$ to be further selected by the reference voltage selection circuit 320 to be used as the input reference voltage $V_{REF}$ to pass to the comparator circuit 308 (FIG. 3B) to be compared to the a positive or negative input circuit voltage $V_{INP}$, $V_{INN}$.

With continuing reference to FIG. 3A, a filter circuit 310 (e.g., a resistor R coupled to a capacitor C coupled to ground) is coupled inline between the programmable voltage reference generation circuit 306 (and more specifically the reference voltage selection circuit 320) and the comparator circuit 308 to filter out noise and/or other frequency components of the passed input reference voltage $V_{REF}$. The comparator circuit 308 is configured to compare the passed input reference voltage $V_{REF}$ to a selected positive or negative input circuit voltage $V_{INP}$, $V_{INN}$ from the measured circuit (e.g., from a circuit to be calibrated) and generate a digital measurement signal 311 (FIG. 3B) (e.g., a logic '0' or logic '1') based on the comparison. The comparator circuit 308 operates like an ADC circuit. For example, if the positive input circuit voltage $V_{INP}$ is selected to be compared to the input circuit voltage $V_{IN}$, and the positive input circuit voltage $V_{IN}$ is higher than the input reference voltage $V_{REF}$, the comparator circuit 308 may be configured to generate the digital measurement signal 311 as a digital logic '0' value. However, if the positive input circuit voltage $V_{INP}$ is lower than the input reference voltage $V_{REF}$, the comparator circuit 308 may be configured to generate the digital measurement signal 311 as a digital logic '1' value. In this manner, digital measurement signal 311 is an indicator of the voltage level of the input circuit voltage $V_{IN}$ relative to the input reference voltage $V_{REF}$.

More exemplary detail of the ACAL circuit 300 in FIG. 3A will now be discussed, followed by exemplary detail of the comparator circuit 308 of the ACAL circuit 300 in FIG. 3A.

In this regard, with reference to FIG. 3A, the programmable voltage reference generation circuit 306 is provided in the form of the resistor ladder circuit 316 in this example. Similar to the resistor ladder circuit 116 in the ACAL circuit 100 in FIG. 1, the resistor ladder circuit 316 includes a plurality of series-connected resistors $R_0$-$R_X$, with resistor $R_0$ coupled to the positive supply voltage $V_{DD}$ and the last resistor $R_X$ coupled to a ground voltage $V_{SS}$. Tap nodes $T_0$-$T_X$ are formed between adjacent coupled resistors $R_0$-$R_X$. The resistor ladder circuit 316 is a voltage divider circuit where the positive supply voltage $V_{DD}$ is divided across each resistor $R_0$-$R_X$ into 'X' reference step voltages. For example, if 'X' in $R_X$ is equal to thirty-two (31), there would be a total of thirty-two (32) resistors as $R_0$-$R_{31}$. If each of the resistors $R_0$-$R_{31}$ have the same resistance, the positive supply voltage $V_{DD}$ will be split into thirty-two (32) even reference voltage steps $V_{DD}$/32 present at each tap node $T_0$-$T_{31}$. For example, if positive supply voltage $V_{DD}$ is 0.8 Volts, the voltage steps generated at each tap node $T_0$-$T_{31}$ would be 0.8 Volts/32 steps=approximately 25 mV steps. Switches $S_{00}$-$S_{X-1}$ are coupled to each of the resistors $R_0$-$R_X$ that control the coupling of the respective tap nodes $T_0$-$T_X$ to the pre-reference voltage selection circuit 322 discussed below. For example, switches $S_{0-0}$, $S_{0-1}$ are coupled on each side of resistor $R_0$. Switches $S_{1-0}$, $S_{1-1}$ are coupled on each side of resistor $R_1$. Switches $S_{2-0}$, $S_{2-1}$ are coupled on each side of resistor $R_2$. Switches $S_{X-0}$, $S_{X-1}$ are coupled on each side of resistor $R_X$. A reference voltage selection circuit 314 in form of a decoder 324 in this example, selects the stepped voltage to be provided as the step reference voltages $V_{REF0}$, $V_{REF1}$ by the programmable voltage reference generation circuit 306. In this example, the decoder is a 5 to 32 bit decoder that accepts a 5 bit digital word input on decoder inputs din<4:0> and activates one of its 32 decoder outputs SEL<31:0> as the reference voltage programming selection 312. Each decoder output SEL<31:0> is coupled to a respective switch pair $S_{0-0}$, $S_{X-1}$. For example, decoder output SEL<0> is coupled to switches $S_{0-0}$, $S_{0-1}$. Decoder output SEL<X> is coupled to switches $S_{X-0}$, $S_{X-1}$. In this manner, the reference voltage programming selection 312 controls which tap nodes $T_0$-$T_X$ are activated to couple the respective step voltages across the selected resistor $R_0$-$R_X$ to resistor ladder outputs 318(0), 318(1) as step reference voltages $V_{REF0}$, $V_{REF1}$.

Thus, by programming the programmable voltage reference generation circuit 306 through the reference voltage programming selection 312, the programmable voltage reference generation circuit 306 can be controlled to provide and change step reference voltages $V_{REF0}$, $V_{REF1}$ that provide the input reference voltage $V_{REF}$ to the comparator circuit 308 in an iterative manner to measure the input circuit voltage $V_{IN}$ from a measured circuit 302. As an example, a hardware, firmware, or software state machine can be provided in the IC chip to drive the iterative programming of the programmable voltage reference generation circuit 306 to cause the ACAL circuit 300 to measure the positive or negative input circuit voltage $V_{INP}$, $V_{INN}$. As another example, the ACAL circuit 300 can be employed to allow voltages to be set and adjusted in post-production when the ACAL circuit 300 is operational to measure voltages to be measured and adjust operation to compensate for PVT variations.

With continued reference to FIG. 3A, the ACAL circuit 300 in this example also includes a supply circuit 326 configured to provide either the positive supply voltage $V_{DD}$ or a bias current $I_B$ to the programmable voltage reference generation circuit 306 to drive the resistor ladder circuit 316. In this regard, the supply circuit 326 includes a voltage supply circuit 328 that includes a head switch 330 (e.g., a P-type field effect transistor (FET) (PFET)) that is coupled to the positive supply voltage $V_{DD}$ and tap node $T_0$. The head switch 330 includes an enable gate G that is configured to receive an enable signal EN controlling whether the head switch 330 passes the positive supply voltage $V_{DD}$ to tap node $T_0$. In this manner, the head switch 330 can be selective enabled or disabled to control whether the resistor ladder circuit 316 of the programmable voltage reference generation circuit 306 is driven by the positive supply voltage $V_{DD}$. Also, in this example, the supply circuit 326 also includes a current supply circuit 332 configured pass a bias current $I_B$ to the programmable voltage reference generation circuit 306 to drive the resistor ladder circuit 316. The current supply circuit 332 includes a second head switch 334 (e.g., a PFET) that is gate controlled by the complement of the enable signal EN so that the head switch 330 in the voltage supply circuit 328 and the second head switch 334 in the current supply circuit 332 are not active at the same time. A third head switch 336 (e.g., an N-type FET (NFET)) that is gate G controlled to pass the bias current $I_B$ to the tap node $T_0$ of the resistor ladder circuit 316 to drive the resistor ladder circuit 316.

With continued reference to FIG. 3A, in this example, the ACAL circuit 300 also includes the pre-reference voltage selection circuit 322 to provide flexibility in providing different reference voltages to the reference voltage selection circuit 320 to be used as the input reference voltage $V_{REF}$ passed to the comparator circuit 308 (FIG. 3B). In this regard, in this example, the pre-reference voltage selection circuit 322 includes a first pre-reference voltage selection circuit 338(0) and a second pre-reference voltage selection circuit 338(1). The first pre-reference voltage selection circuit 338(0) includes a first pre-reference voltage input 340I(0) coupled to the resistor ladder output 318(0) so that the first pre-reference voltage input 340I(0) is configured to receive the first step reference input voltage $V_{REF0}$. The first pre-reference voltage selection circuit 338(0) also includes a second pre-reference voltage input 342I(0) coupled to the tap node $T_0$ so that the second pre-reference voltage input 342I(0) is configured to receive the ground voltage $V_{SS}$. The second pre-reference voltage selection circuit 338(1) includes a third pre-reference voltage input 340I(1) coupled to the resistor ladder output 318(1) so that the third pre-reference voltage input 340I(1) is configured to receive the second step reference input voltage $V_{REF1}$. The second pre-reference voltage selection circuit 338(1) also includes a fourth pre-reference voltage input 342I(1) coupled to the tap node $T_X$ so that the fourth pre-reference voltage input 342I(1) is configured to receive the positive supply voltage $V_{DD}$.

The first pre-reference voltage selection circuit 338(0) and a second pre-reference voltage selection circuit 338(1) can be provided as respective multiplexer circuits 344(0), 344(1). Both multiplexer circuits 344(0), 344(1) include a respective first and second pre-reference voltage selection input 346I(0), 346I(1) that control which received input to pass to a respective first and second pre-reference voltage output 348O(0), 348O(1). The first and second pre-reference voltage selection input 346I(0), 346I(1) are both configured to receive the same selection signal (SEL_VDDREF). The first pre-reference voltage selection circuit 338(0) is configured to pass one of the first step reference voltage $V_{REF0}$ generated by the programmable voltage reference generation circuit 306 and the ground voltage $V_{SS}$ to the first pre-reference voltage output 348O(0). The second pre-reference voltage selection circuit 338(1) is configured to pass one of the second step reference voltage $V_{REF1}$ generated by the programmable voltage reference generation circuit 306 and the positive supply voltage $V_{DD}$ to the second pre-reference voltage output 348O(1). In this manner, the ACAL circuit 300 is flexible and configurable to pass any of the step reference voltages $V_{REF0}$, $V_{REF1}$ and positive supply and ground voltages $V_{DD}$, $V_{SS}$ to be used as the input reference voltage $V_{REF}$ to the comparator circuit 308 (FIG. 3B).

With continuing reference to FIG. 3A, the ACAL circuit 300 also includes the reference voltage selection circuit 320. The reference voltage selection circuit 320 can be provided as a multiplexor circuit 350. The reference voltage selection circuit 320 has a first reference voltage input 352(0) that is coupled to the second pre-reference voltage output 348O(1) of the second pre-reference voltage selection circuit 338(1). The reference voltage selection circuit 320 also has a second reference voltage input 352(1) that is coupled to the first pre-reference voltage output 348O(0) of the first pre-reference voltage selection circuit 338(0). The reference voltage selection circuit 320 includes a reference voltage selection input 354 that controls whether the signal on the first or second reference voltage input 352(0), 352(1) is passed to a reference voltage selection output 356 coupled to the filter circuit 310. In this manner, the reference voltage selection circuit 320 provides additional flexibility in being able to select to pass any of the step reference voltages $V_{REF0}$, $V_{REF1}$ and positive supply and ground voltages $V_{DD}$, $V_{SS}$ based on the control of the pre-reference voltage selection circuit 322 and reference voltage selection circuit 320 being used as the input reference voltage $V_{REF}$ to the comparator circuit 308 (FIG. 3B).

With continuing reference to FIG. 3A, the ACAL circuit 300 in this example also includes a modulator circuit 358, which may be provided as a delta-sigma modulator. The modulator circuit 358 includes a modulator output 360 that is coupled to the reference voltage selection input 354 of the reference voltage selection circuit 320 to control which signal on the first and second reference voltage inputs 352(0), 352(1) is passed to a reference voltage selection output 356 coupled to the filter circuit 310. The modulator circuit 358 is configured to generate a pulse-width modulated (PWM) signal 362 on the modulator output 360 to control the durations of time in which the reference voltage selection circuit 320 passes a reference voltage from the first and second reference voltage inputs 352(0), 352(1) to the reference voltage selection output 356. This allows the input voltage reference $V_{REF}$ generated on the reference voltage selection output 356 to be an interpolation (i.e., a mix) of the voltage reference signals on the first and second reference voltage inputs 352(0), 352(1). An interpolated input reference voltage $V_{REF}$ may have less noise or interference to provide for a more accurate measurement by the comparator circuit 308 (FIG. 3B).

The duty cycle of the PWM signal 362 controls the weighting of the voltage references on the first and second reference voltage inputs 352(0), 352(1) to generate the input reference voltage $V_{REF}$. Modulating the reference voltages on the first and second reference voltage inputs 352(0), 352(1) allows a higher resolution input reference voltage $V_{REF}$ to be generated to allow the comparator circuit 308 (FIG. 3B) to even more precisely measure an input circuit voltage $V_{INP}$, $V_{INN}$. The modulator circuit 358 has a modulator input 364 that is configured to receive a modulator input code dsm_code<12:0> that controls the duty cycle of the PWM signal 362. In this example, the modulator circuit 358 is configured to generate $2^{13}$ different PWMs in the PWM signal 362 with a 13 bit modulator input code dsm_code<12:0>. This provides for the resolution of the input reference voltage $V_{REF}$ to be $2^{13}$ different voltages levels between the reference voltages passed on the first and second reference voltage inputs 352(0), 352(1). For example, if the step reference voltages $V_{REF0}$, $V_{REF1}$ are selected by the pre-reference voltage selection circuit 322 to be passed on the first and second reference voltage inputs 352(0), 352(1) with a 25 mV differential, the modulator circuit 358 can provide a 3.05 microVolt (µV) resolution by dividing the 25 mV differential into $2^{13}$ steps.

Also, with the reference voltage selection circuit 320 and modulator circuit 358 allowing the input reference voltage $V_{REF}$ to be switched in a higher resolution of voltage steps, the components (e.g., resistor(s) and capacitor(s)) of the filter circuit 310 can be sized smaller, of a smaller resistance and capacitance, to adequately filter the input reference voltage $V_{REF}$. The filter circuit 310 may often consume a larger or the largest area in the ACAL circuit 300 because of the nature in which filter components are fabricated in the IC chip. A reduced size filter circuit 310 may allow larger number of ACAL circuits 300 to be included in an IC chip and/or located in closer proximity on the die of the IC chip to the circuits to be measured or calibrated by the respective ACAL circuits 300. Thus, a larger number of reduced-footprint ACAL circuits 300 may be able be placed in closer physical proximity to circuits to be measured or calibrated. In this manner, routing delay between the on-chip ACAL circuits 300 and their respective calibrated or measured on-chip circuits can be reduced to mitigate any reduction in performance due to calibration delay. Also, providing a larger number of smaller footprint on-chip ACAL circuits 300 that are more dedicated to particular circuits on the chip may reduce the overall power consumption by the ACAL circuits 300.

Thus, as shown in FIG. 3A, the input reference voltage $V_{REF}$ that is generated as a result of the reference voltage programming selection 312, control of the pre-reference voltage selection circuit 322 and reference voltage selection circuit 320, and the interpolation of reference voltages in the reference voltage selection circuit 320 controlled by the modulator circuit 358, is provided as the input reference voltage $V_{REF}$ to the comparator circuit 308 in FIG. 3B. With reference to FIG. 3B, the comparator circuit 308 in this ACAL circuit 300 in this example includes an op-amp 309 that includes a first comparator input 366(0) configured to receive a first input reference voltage and a second comparator input 366(1) configured to receive a second input reference voltage to be compared. The op-amp 309 is an auto-zeroing op-amp 309 in this example to zero out offset of the op-amp 309. The op-amp 309 is configured to compare the input reference voltage on the first comparator input 366(0) to the input circuit voltage on the second comparator input 366(1) and generate an output voltage $V_{OUT}$ on an op-amp output 368 representing the differential between the input reference voltage on the first comparator input 366(0) and the input circuit voltage on the second comparator input 366(1). In this example, the comparator circuit 308 includes a latch circuit 370 that is configured to latch the output voltage $V_{OUT}$. The comparator circuit 308 also includes an S-R flip-flop 372 that is configured to generate a digital measurement signal 311 representing the differential between the input reference voltage on the first comparator input 366(0) and the input circuit voltage on the second comparator input 366(1) based on the output voltage $V_{OT}$.

In this example, with continued reference to FIG. 3B, the ACAL circuit 300 includes a mode selector circuit 374 that provides the flexibility to provide any of the input reference voltage $V_{REF}$, the step reference voltages $V_{REF0}$, $V_{REF1}$, and the positive and negative input circuit voltages $V_{INP}$, $V_{INN}$, on the first and second comparator inputs 366(0), 366(1) of the op-amp 309. The mode selector circuit 374 is controlled by a mux selection 377 to control which of the input reference voltage $V_{REF}$, the step reference voltages $V_{REF0}$, $V_{REF1}$, and the positive and negative input circuit voltages $V_{INP}$, $V_{INN}$ are passed to mode selector outputs 380(0)-380 (3) to the first and second comparator inputs 366(0), 366(1) of the op-amp 309. A non-overlapping clock phase generator 376 is provided that generates non-overlapping clock signals 378(1), 378(2) to control respective switches on mode selector outputs 380(0)-380(3) of the mode selector circuit 374 to control which signals among the input reference voltage $V_{REF}$, the step reference voltages $V_{REF0}$, $V_{REF1}$, and the positive and negative input circuit voltages $V_{INP}$, $V_{INN}$ are coupled to the first and second comparator inputs 366(0), 366(1) of the op-amp 309. This allows different measurement modes to be performed by the ACAL circuit 300 as will be described in more detail below with regard to FIGS. 4A-4B and 5.

FIG. 4A is a chart 400 illustrating different measurement modes of operation of the ACAL circuit 300 in FIGS. 3A and 3B based on programmable selections for the ACAL circuit 300. In this example, there are five (5) different measurement modes—mode 1 through mode 5 as shown in the mode column 402. Mode 1 is a for a single-ended voltage measurement based on the equation 1 450(1) in FIG. 4B. To control the ACAL circuit 300 to operate in measurement mode 1, the mux selection 377 is set to the bits '0000' and the selection signal (SEL_VDDREF) is set to 0. This causes the pre-reference voltage selection circuit 322 to pass the step reference voltages $V_{REF0}$, $V_{REF1}$ to the reference voltage selection circuit 320 to be mixed and to provide the input reference voltage $V_{REF}$. In response to the mux selector 377 being set to '0000', the mode selector circuit 374 passes the positive input circuit voltage $V_{INP}$ to mode selector outputs 380(0), 380(3), and passes the input reference voltage $V_{REF}$ to mode selector outputs 380(1), 380(2). Then, based on the control by the non-overlapping clock phase generator 376, the op-amp 309 is configured to receive the positive input circuit voltage $V_{INP}$ and the input reference voltage $V_{REF}$ on the first and second comparator inputs 366(0), 366(1) in a first clock cycle, respectively, and then reversed in a second clock cycle to perform the single-ended voltage measurement in equation 1 450(1) in FIG. 4B.

With continuing reference to FIG. 4A, mode 2 is for a differential voltage measurement based on the equation 2 450(2) in FIG. 4B. To control the ACAL circuit 300 to operate in measurement mode 2, the mux selection 377 is set to the bits '0001' and the selection signal (SEL_VDDREF) is set to '0'. This causes the pre-reference voltage selection circuit 322 to pass the step reference voltages $V_{REF0}$, $V_{REF1}$ to the reference voltage selection circuit 320 to be mixed and as the input reference voltage $V_{REF}$. In response to the mux selector 377 being set to '0001', the mode selector circuit 374 passes the positive input circuit voltage $V_{INP}$ to mode selector output 380(0), the negative input circuit voltage $V_{INN}$ to mode selector output 380(1), the input reference voltage $V_{REF}$ to mode selector output 380(2), and 0 V on mode selector output 380(3). Then, based on the control by the non-overlapping clock phase generator 376, the op-amp 309 is configured to receive positive input circuit voltage $V_{INP}$ and the input reference voltage $V_{REF}$ on the first and second comparator inputs 366(0), 366(1) in a first clock cycle, respectively. Then the op-amp 309 is configured to receive negative input circuit voltage $V_{INN}$ and 0 V on the first and second comparator inputs 366(0), 366(1) in a second clock cycle, to perform the differential voltage measurement in equation 2 450(2) in FIG. 4B.

With continuing reference to FIG. 4A, mode 5 is for a differential voltage measurement with no input reference voltage $V_{REF}$ based on the equation 5 450(5) in FIG. 4B. To control the ACAL circuit 300 to operate in measurement mode 5, the mux selection 377 is set to the bits '0100' and the selection signal (SEL_VDDREF) is set to '0'. This causes the pre-reference voltage selection circuit 322 to pass the step reference voltages $V_{REF0}$, $V_{REF1}$ to the reference voltage selection circuit 320 to be mixed and as the input reference voltage $V_{REF}$. In response to the mux selector 377 being set to '0100', the mode selector circuit 374 passes the positive input circuit voltage $V_{INP}$ to mode selector output 380(0), the negative input circuit voltage $V_{INN}$ to mode selector output 380(1), the negative input circuit voltage $V_{INN}$ to mode selector output 380(2), and the positive input circuit voltage $V_{INP}$ on mode selector output 380(3). Then, based on the control by the non-overlapping clock phase generator 376, the op-amp 309 is configured to receive positive input circuit voltage $V_{INP}$ and the negative input circuit voltage $V_{INN}$ on the first and second comparator inputs 366(0), 366(1) in a first clock cycle, respectively. Then the op-amp 309 is configured to receive the positive input circuit voltage $V_{INP}$ and the negative input circuit voltage $V_{INN}$ on the first and second comparator inputs 366(0), 366(1) in a second clock cycle, to perform the differential voltage measurement in equation 5 450(5) in FIG. 4B.

The mode selector circuit 374 is also configured to allow for test modes of the ACAL circuit 300. Modes 3 and 4 illustrated in FIGS. 4A and 4B are test modes of the ACAL circuit 300. Measurement mode 3 is the same as measurement mode 1, but instead of using an input reference voltage $V_{REF}$ based on an interporation of step reference voltages $V_{REF0}$, $V_{REF1}$, the input reference voltage $V_{REF}$ is based on an interpolation of the positive supply and ground voltages $V_{DD}$, $V_{SS}$. In this regard, to control the ACAL circuit 300 to operate in test measurement mode 3, the mux selection 377 is set to the bits '0010' and the selection signal (SEL_VDDREF) is set to '1'. This causes the pre-reference voltage selection circuit 322 to pass the positive supply and ground voltages $V_{DD}$, $V_{SS}$ to the reference voltage selection circuit 320 to be mixed and as the input reference voltage $V_{REF}$. In response to the mux selector 377 being set to '0010', the mode selector circuit 374 passes the step reference voltage $V_{REF1}$ to mode selector output 380(0), the input reference voltage $V_{REF}$ (based on interpolation of the positive supply and ground voltages $V_{DD}$, $V_{SS}$) to mode selector output 380(1), the input reference voltage $V_{REF}$ (based on interpolation of the positive supply and ground voltages $V_{DD}$, $V_{SS}$) to mode selector output 380(2), and the step reference voltage $V_{REF1}$ on mode selector output 380(3). Then, based on the control by the non-overlapping clock phase generator 376, the op-amp 309 is configured to receive the step reference voltage $V_{REF1}$ and the input reference voltage $V_{REF}$ (based on interpolation of the positive and ground voltages $V_{DD}$, $V_{SS}$) on the first and second comparator inputs 366(0), 366(1) in a first clock cycle, respectively. Then the op-amp 309 is configured to receive the input reference voltage Van (based on interpolation of the positive and ground voltages $V_{DD}$, $V_{SS}$) and the step reference voltage $V_{REF1}$ on the first and second comparator inputs 366(0), 366(1) in a second clock cycle, to perform the single-ended voltage measurement in equation 3 450(3) based on a reference voltage of an interpolation of the positive supply and ground voltages $V_{DD}$, $V_{SS}$ in FIG. 4B.

Measurement mode 4 in FIGS. 4A and 4B is the same as measurement mode 3, step reference voltage $V_{REF0}$ is used as reference voltage instead of step reference voltage $V_{REF1}$. In this regard, to control the ACAL circuit 300 to operate in test measurement mode 3, the mux selection 377 is set to the bits '0011' and the selection signal (SEL_VDDREF) is set to '1'. This causes the pre-reference voltage selection circuit 322 to pass the positive supply and ground voltages $V_{DD}$, $V_{SS}$ to the reference voltage selection circuit 320 to be mixed and as the input reference voltage $V_{REF}$. In response to the mux selector 377 being set to '0011', the mode selector circuit 374 passes the step reference voltage $V_{REF0}$ to mode selector output 380(0), the input reference voltage $V_{REF}$ (based on interpolation of the positive supply and ground voltages $V_{DD}$, $V_{SS}$) to mode selector output 380(1), the input reference voltage $V_{REF}$ (based on interpolation of the positive supply and ground voltages $V_{DD}$, $V_{SS}$) to mode selector output 380(2), and the step reference voltage $V_{REF0}$ on mode selector output 380(3). Then, based on the control by the non-overlapping clock phase generator 376, the op-amp 309 is configured to receive the step reference voltage $V_{REF0}$ and the input reference voltage $V_{REF}$ (based on interpolation of the positive supply and ground voltages $V_{DD}$, $V_{SS}$) on the first and second comparator inputs 366(0), 366(1) in a first clock cycle, respectively. Then the op-amp 309 is configured to receive the input reference voltage $V_{REF}$ (based on interpolation of the positive supply and ground voltages $V_{DD}$, $V_{SS}$) and the step reference voltage $V_{REF0}$ on the first and second comparator inputs 366(0), 366(1) in a second clock cycle, to perform the single-ended voltage measurement in equation 4 450(4) based on a reference voltage of an interpolation of the positive supply and ground voltages $V_{DD}$, $V_{SS}$ in FIG. 4B.

FIG. 5 is a block diagram of an exemplary processor-based system 500 that includes a processor 502 with one or more CPU cores 504(1)-504(P) each configured to execute computer instructions for execution. The processor-based system also includes an ACAL circuit(s) 506 that includes a programmable voltage reference generation circuit configured to provide an input reference voltage based on programmed step reference voltage(s) to a comparator circuit to be used to measure an input circuit voltage from a measured circuit, wherein the programmable voltage reference generation circuit supports programming of different step reference voltage(s), and in an iterative manner to more precisely measure the input circuit voltage 508. For example, the ACAL circuit(s) 506 can measure an input circuit voltage 508 of a measured circuit 510 in the processor-based system 500. The ACAL circuit 506 can include, without limitation, the ACAL circuits 100 and 300 in FIGS. 1 and 3A-3B, respectively. Also, the processor 502 in the processor-based system 500 can be configured to communicate a reference voltage programming selection 513 to the ACAL circuit(s) 506 and control the programming of the step reference voltage programmed to be selected by the programmable voltage reference generation circuit to generate an input reference voltage to cause the ACAL circuit(s) 506 to measure the input circuit voltage 508 of the measured circuit 510 and generate a digital measurement signal 511 of the measured input circuit voltage 508. For example, the processor 502 may execute computer instructions as discussed in more detail below, wherein such computer instructions can be part of an instruction program to control the ACAL circuit 506 to measure the input circuit voltage 508 of the measured circuit 510, and in an iterative fashion, if desired.

With continuing reference to FIG. 5, the processor-based system 500 may be a circuit or circuits included in an electronic board card, such as, a printed circuit board (PCB), a server, a personal computer, a desktop computer, a laptop computer, a personal digital assistant (PDA), a computing pad, a mobile device, or any other device, and may represent, for example, a server or a user's computer. The processor 502 represents one or more general-purpose processing circuits, such as a microprocessor, central processing unit, or the like. The processor 502 is configured to execute processing logic in computer instructions for performing the operations and steps discussed herein. The processor 502 also includes an instruction cache 512 for temporary, fast access memory storage of instructions. Fetched or prefetched instructions from a memory, such as from a system memory 514 over a system bus 516, are stored in the instruction cache 512.

The processor 502 and the system memory 514 are coupled to the system bus 516 and can intercouple peripheral devices included in the processor-based system 500. As is well known, the processor 502 communicates with these other devices by exchanging address, control, and data information over the system bus 516. For example, the processor 502 can communicate bus transaction requests to a memory controller 518 in the system memory 514 as an example of a slave device. Although not illustrated in FIG. 5, multiple system buses 516 could be provided, wherein each system bus constitutes a different fabric. In this example, the memory controller 518 is configured to provide memory access requests to a memory array 520 in the system memory 514. The memory array 520 is comprised of an array of storage bit cells for storing data. The system memory 514 may be a read-only memory (ROM), flash memory, dynamic random access memory (DRAM), such as synchronous DRAM (SDRAM), etc., and a static memory (e.g., flash memory, static random access memory (SRAM), etc.), as non-limiting examples.

Other devices can be connected to the system bus 516. As illustrated in FIG. 5, these devices can include the system memory 514, one or more input device(s) 522, one or more output device(s) 524, a modem 526, and one or more display controllers 528, as examples. The input device(s) 522 can include any type of input device, including but not limited to input keys, switches, voice processors, etc. The output device(s) 524 can include any type of output device, including but not limited to audio, video, other visual indicators, etc. The modem 526 can be any device configured to allow exchange of data to and from a network 530. The network 530 can be any type of network, including but not limited to a wired or wireless network, a private or public network, a local area network (LAN), a wireless local area network (WLAN), a wide area network (WAN), a BLUETOOTH™ network, and the Internet. The modem 526 can be configured to support any type of communications protocol desired. The processor 502 may also be configured to access the display controller(s) 528 over the system bus 516 to control information sent to one or more displays 532. The display(s) 532 can include any type of display, including but not limited to a cathode ray tube (CRT), a liquid crystal display (LCD), a plasma display, etc.

The processor-based system 500 in FIG. 5 may include a set of instructions 534 that may include conditional control instructions that cause such instructions to either be CI instructions or CD instructions. The instructions 534 may be stored in the system memory 514, processor 502, and/or instruction cache 512 as examples of non-transitory computer-readable medium 536. The instructions 534 may also reside, completely or at least partially, within the system memory 514 and/or within the processor 502 during their execution. The instructions 534 may further be transmitted or received over the network 530 via the modem 526, such that the network 530 includes the non-transitory computer-readable medium 536.

While the non-transitory computer-readable medium 536 is shown in an exemplary embodiment to be a single medium, the term "computer-readable medium" should be taken to include a single medium or multiple media (e.g., a centralized or distributed database, and/or associated caches and servers) that store the one or more sets of instructions. The term "computer-readable medium" shall also be taken to include any medium that is capable of storing, encoding, or carrying a set of instructions for execution by the processing device and that cause the processing device to perform any one or more of the methodologies of the embodiments disclosed herein. The term "computer-readable medium" shall accordingly be taken to include, but not be limited to, solid-state memories, optical medium, and magnetic medium.

The embodiments disclosed herein include various steps. The steps of the embodiments disclosed herein may be formed by hardware components or may be embodied in machine-executable instructions, which may be used to cause a general-purpose or special-purpose processor programmed with the instructions to perform the steps. Alternatively, the steps may be performed by a combination of hardware and software.

The embodiments disclosed herein may be provided as a computer program product, or software, that may include a machine-readable medium (or computer-readable medium) having stored thereon instructions, which may be used to program a computer system (or other electronic devices) to perform a process according to the embodiments disclosed herein. A machine-readable medium includes any mechanism for storing or transmitting information in a form readable by a machine (e.g., a computer). For example, a machine-readable medium includes: a machine-readable storage medium (e.g., ROM, random access memory (RAM), a magnetic disk storage medium, an optical storage medium, flash memory devices, etc.) and the like.

Unless specifically stated otherwise and as apparent from the previous discussion, it is appreciated that throughout the description, discussions utilizing terms such as "processing," "computing," "determining," "displaying," or the like, refer to the action and processes of a computer system, or similar electronic computing device, that manipulates and transforms data and memories represented as physical (electronic) quantities within the computer system's registers into other data similarly represented as physical quantities within the computer system memories, registers, or other such information storage, transmission, or display devices.

The algorithms and displays presented herein are not inherently related to any particular computer or other apparatus. Various systems may be used with programs in accordance with the teachings herein, or it may prove convenient to construct more specialized apparatuses to perform the required method steps. The required structure for a variety of these systems will appear from the description above. In addition, the embodiments described herein are not described with reference to any particular programming language. It will be appreciated that a variety of programming languages may be used to implement the teachings of the embodiments as described herein.

Those of skill in the art will further appreciate that the various illustrative logical blocks, modules, circuits, and algorithms described in connection with the embodiments disclosed herein may be implemented as electronic hardware, instructions stored in memory or in another computer-readable medium, and executed by a processor or other processing device, or combinations of both. The components of the distributed antenna systems described herein may be employed in any circuit, hardware component, integrated circuit (IC), or IC chip, as examples. Memory disclosed herein may be any type and size of memory and may be configured to store any type of information desired. To clearly illustrate this interchangeability, various illustrative components, blocks, modules, circuits, and steps have been described above generally in terms of their functionality. How such functionality is implemented depends on the particular application, design choices, and/or design constraints imposed on the overall system. Skilled artisans may implement the described functionality in varying ways for each particular application, but such implementation decisions should not be interpreted as causing a departure from the scope of the present embodiments.

The various illustrative logical blocks, modules, and circuits described in connection with the embodiments disclosed herein may be implemented or performed with a processor, a Digital Signal Processor (DSP), an Application Specific Integrated Circuit (ASIC), a Field Programmable Gate Array (FPGA), or other programmable logic device, a discrete gate or transistor logic, discrete hardware components, or any combination thereof designed to perform the functions described herein. Furthermore, a controller may be a processor. A processor may be a microprocessor, but in the alternative, the processor may be any conventional processor, controller, microcontroller, or state machine. A processor may also be implemented as a combination of computing devices (e.g., a combination of a DSP and a microprocessor, a plurality of microprocessors, one or more microprocessors in conjunction with a DSP core, or any other such configuration).

The embodiments disclosed herein may be embodied in hardware and in instructions that are stored in hardware, and may reside, for example, in RAM, flash memory, ROM, Electrically Programmable ROM (EPROM), Electrically Erasable Programmable ROM (EEPROM), registers, a hard disk, a removable disk, a CD-ROM, or any other form of computer-readable medium known in the art. An exemplary storage medium is coupled to the processor such that the processor can read information from, and write information to, the storage medium. In the alternative, the storage medium may be integral to the processor. The processor and the storage medium may reside in an ASIC. The ASIC may reside in a remote station. In the alternative, the processor and the storage medium may reside as discrete components in a remote station, base station, or server.

It is also noted that the operational steps described in any of the exemplary embodiments herein are described to provide examples and discussion. The operations described may be performed in numerous different sequences other than the illustrated sequences. Furthermore, operations described in a single operational step may actually be performed in a number of different steps. Additionally, one or more operational steps discussed in the exemplary embodiments may be combined. Those of skill in the art will also understand that information and signals may be represented using any of a variety of technologies and techniques. For example, data, instructions, commands, information, signals, bits, symbols, and chips, that may be referenced throughout the above description, may be represented by voltages, currents, electromagnetic waves, magnetic fields, or particles, optical fields or particles, or any combination thereof.

Unless otherwise expressly stated, it is in no way intended that any method set forth herein be construed as requiring that its steps be performed in a specific order. Accordingly, where a method claim does not actually recite an order to be followed by its steps, or it is not otherwise specifically stated in the claims or descriptions that the steps are to be limited to a specific order, it is in no way intended that any particular order be inferred.

It will be apparent to those skilled in the art that various modifications and variations can be made without departing from the spirit or scope of the invention. Since modifications, combinations, sub-combinations, and variations of the disclosed embodiments incorporating the spirit and substance of the invention may occur to persons skilled in the art, the invention should be construed to include everything within the scope of the appended claims and their equivalents.

What is claimed is:

1. An analog calibration (ACAL) circuit, comprising:
a programmable voltage reference generation circuit configured to:
generate a step reference voltage among a plurality of programmable step reference voltages based on a supply voltage and a reference voltage programming selection selected by a reference voltage selection circuit;
the ACAL circuit configured to generate an input reference voltage based on the selected step reference voltage;
further comprising:
a comparator circuit configured to:
compare the input reference voltage to an input circuit voltage from a measured circuit; and
generate a digital measurement signal based on a difference between the input reference voltage and the input circuit voltage; and
the ACAL circuit further configured to:
determine if the input reference voltage is greater than the input circuit voltage based on the digital measurement signal; and
in response to the digital measurement signal indicating the input reference voltage is greater than the input circuit voltage:
generate a next step reference voltage among the plurality of programmable step reference voltages based on the supply voltage and a next reference voltage programming selection; and
generate the input reference voltage based on the next selected step reference voltage.

2. The ACAL circuit of claim 1, wherein:
the programmable voltage reference generation circuit is further configured to generate a second step reference voltage among the plurality of programmable step reference voltages based on the supply voltage and the reference voltage programming selection generated by the reference voltage selection circuit; and the ACAL circuit configured to generate the input reference voltage based on the selected step reference voltage and the second step reference voltage.

3. The ACAL circuit of claim 1, wherein the programmable voltage reference generation circuit comprises:
a resistor ladder circuit coupled between a supply node configured to be coupled to the supply voltage and a ground node;
the resistor ladder circuit, comprising:
a resistor ladder output; and
a plurality of resistors connected in series forming a plurality of tap nodes between each resistor among the plurality of resistors, wherein each tap node among the plurality of tap nodes is configured to have the step reference voltage based on the supply voltage; and
the programmable voltage reference generation circuit is configured to generate the step reference voltage by being configured to:
receive the reference voltage programming selection;
activate a tap node in the resistor ladder circuit based on the received reference voltage programming selection to select the step reference voltage at the activated tap node; and
provide the step reference voltage at the activated tap node as the input reference voltage on the resistor ladder output.

4. The ACAL circuit of claim 3, wherein the programmable voltage reference generation circuit further comprises a second resistor ladder output;
the programmable voltage reference generation circuit further configured to generate the second step reference voltage by being configured to:
activate a second tap node in the resistor ladder circuit coupled to the resistor coupled to the activated tap node, based on the received reference voltage programming selection; and
provide the second step reference voltage at the second activated tap node as a second input reference voltage on the second resistor ladder output, wherein the input reference voltage and the second input reference voltage form differential step reference voltages of a voltage drop across the resistor.

5. The ACAL circuit of claim 3, wherein:
the resistor ladder circuit further comprises a plurality of tap node switches each coupled to each tap node among the plurality of tap nodes;
the reference voltage selection circuit comprising an X to Y decoder circuit, comprising:
X number of decoder inputs; and
Y number of decoder outputs each coupled to a tap node switch among the plurality of tap node switches; and
the X to Y decoder circuit configured to:
receive the reference voltage programming selection; and
activate a decoder output among Y decoder outputs based on the reference voltage programming selection to activate the tap node switch coupled to the activated decoder output.

6. The ACAL circuit of claim 1, further comprising a supply circuit configured to provide the supply voltage to the programmable voltage reference generation circuit, the supply circuit comprising:

a voltage supply circuit configured to couple a received supply voltage to the programmable voltage reference generation circuit in response to receiving a supply activation signal indicating a voltage supply selection; and
a current supply circuit configured to couple a received supply current to the programmable voltage reference generation circuit in response to receiving the supply activation signal indicating a current supply selection.

7. The ACAL circuit of claim 2, further comprising the reference voltage selection circuit comprising:
a first reference voltage input configured to receive the step reference voltage;
a second reference voltage input configured to receive the second step reference voltage;
a reference voltage selection input configured to receive a reference voltage selection; and
a reference voltage selection output coupled to the comparator circuit;
the reference voltage selection circuit configured to:
receive the step reference voltage on the first reference voltage input;
receive the second step reference voltage on the second reference voltage input; and
provide the selected step reference voltage among the step reference voltage and the second step reference voltage as the input reference voltage on the reference voltage selection output, based on the received reference voltage selection.

8. The ACAL circuit of claim 7, further comprising:
a modulator circuit comprising a modulator output coupled to the reference voltage selection input of the reference voltage selection circuit;
the modulator circuit configured to generate a pulse width modulated (PWM) signal on the modulator output based on a received modulator input code indicating a duty cycle for the PWM signal; and
the reference voltage selection circuit configured to provide the selected step reference voltage as the input reference voltage on the reference voltage selection output, based on an interpolation of the step reference voltage and the second step reference voltage according to the modulation of the PWM signal.

9. The ACAL circuit of claim 7, further comprising:
a first pre-reference voltage selection circuit, comprising:
a first pre-reference voltage input configured to receive a step reference input voltage;
a second pre-reference voltage input configured to receive the supply voltage;
a first pre-reference voltage selection input configured to receive a first pre-reference voltage selection; and
a first pre-reference voltage output coupled to the first reference voltage input of the reference voltage selection circuit;
the first pre-reference voltage selection circuit configured to:
receive the step reference voltage on the first pre-reference voltage input;
receive the supply voltage on the second pre-reference voltage input; and
provide a selected voltage among the step reference voltage and the supply voltage as the step reference voltage on the first pre-reference voltage output, based on the received first pre-reference voltage selection; and
a second pre-reference voltage selection circuit, comprising:

a third pre-reference voltage input configured to receive the second step reference input voltage;
a fourth pre-reference voltage input configured to receive a ground voltage;
a second pre-reference voltage selection input configured to receive a second pre-reference voltage selection; and
a second pre-reference voltage output coupled to the second reference voltage input of the reference voltage selection circuit;

the second pre-reference voltage selection circuit configured to:
receive the second step reference voltage on the third pre-reference voltage input;
receive the ground voltage on the fourth pre-reference voltage input; and
provide a selected voltage among the step reference voltage and the ground voltage as the second step reference voltage on the second pre-reference voltage output, based on the received second pre-reference voltage selection.

10. The ACAL circuit of claim 1, further comprising a filter circuit coupled between the programmable voltage reference generation circuit and the comparator circuit;
the filter circuit configured to filter out frequencies beyond a pass frequency in the input reference voltage.

11. The ACAL circuit of claim 7, further comprising a filter circuit coupled to the reference voltage selection output of the reference voltage selection circuit and the comparator circuit;
the filter circuit configured to filter out frequencies beyond a pass frequency in the input reference voltage.

12. The ACAL circuit of claim 1, wherein:
the comparator circuit comprises:
a first comparator input configured to receive the input reference voltage;
a second comparator input configured to receive the input circuit voltage from the measured circuit; and
a measurement output;
the comparator circuit configured to:
compare the input reference voltage on the first comparator input to the input circuit voltage on the second comparator input; and
generate the digital measurement signal on the measurement output based on the difference between the input reference voltage and the input circuit voltage.

13. The ACAL circuit of claim 2, wherein:
the comparator circuit comprises:
a first comparator input configured to receive a first input voltage;
a second comparator input configured to receive a second input voltage; and
a measurement output;
the comparator circuit configured to:
compare the first input voltage on the first comparator input to the second input voltage on the second comparator input; and
generate the digital measurement signal on the measurement output based on a difference between the first input voltage and the second input voltage; and
further comprising:
a mode selector circuit configured to:
receive the input reference voltage;
receive the step reference voltage;
receive the second step reference voltage;
receive a positive input circuit voltage of the input circuit voltage;
receive a negative input circuit voltage of the input circuit voltage;
receive a mode selection indicating an operation mode of the ACAL circuit;
couple one of the input reference voltage, the step reference voltage, the second step reference voltage, the positive input circuit voltage, and the negative input circuit voltage to the first comparator input, based on the mode selection; and
couple one of the input reference voltage, the step reference voltage, the second step reference voltage, the positive input circuit voltage, and the negative input circuit voltage to the second comparator input, based on the mode selection.

14. The ACAL circuit of claim 13, wherein the mode selector circuit is configured to, in response to the mode selection indicating a single-ended voltage mode:
couple the positive input circuit voltage to the first comparator input of the comparator circuit in a first clock cycle;
couple the input reference voltage to the second comparator input of the comparator circuit in the first clock cycle;
couple the input reference voltage to the first comparator input of the comparator circuit in a second clock cycle following the first clock cycle; and
couple the input circuit voltage to the second comparator input of the comparator circuit in the second clock cycle.

15. The ACAL circuit of claim 13, wherein the mode selector circuit is configured to, in response to the mode selection indicating a single-ended voltage mode:
couple the positive input circuit voltage to the first comparator input of the comparator circuit in a first clock cycle;
couple the negative input circuit voltage to the second comparator input of the comparator circuit in the first clock cycle;
couple the input reference voltage to the first comparator input of the comparator circuit in a second clock cycle following the first clock cycle; and
couple a ground voltage to the second comparator input of the comparator circuit in the second clock cycle.

16. The ACAL circuit of claim 13, wherein the mode selector circuit is configured to, in response to the mode selection indicating a single-ended voltage mode:
couple the step reference voltage to the first comparator input of the comparator circuit in a first clock cycle;
couple the input reference voltage to the second comparator input of the comparator circuit in the first clock cycle;
couple the input reference voltage to the first comparator input of the comparator circuit in a second clock cycle following the first clock cycle; and
couple the step reference voltage to the second comparator input of the comparator circuit in the second clock cycle.

17. The ACAL circuit of claim 13, wherein the mode selector circuit is configured to, in response to the mode selection indicating a single-ended voltage mode:
couple the second step reference voltage to the first comparator input of the comparator circuit in a first clock cycle;
couple the input reference voltage to the second comparator input of the comparator circuit in the first clock cycle;

couple the input reference voltage to the first comparator input of the comparator circuit in a second clock cycle following the first clock cycle; and couple the second step reference voltage to the second comparator input of the comparator circuit in the second clock cycle.

18. The ACAL circuit of claim 13, wherein the mode selector circuit is configured to, in response to the mode selection indicating a single-ended voltage mode:

couple the positive input circuit voltage to the first comparator input of the comparator circuit in a first clock cycle;

couple the negative input circuit voltage to the second comparator input of the comparator circuit in the first clock cycle;

couple the negative input circuit voltage to the first comparator input of the comparator circuit in a second clock cycle following the first clock cycle; and couple the positive input circuit voltage to the second comparator input of the comparator circuit in the second clock cycle.

19. A method of measuring an input circuit voltage of a measured circuit, comprising:

setting a reference voltage programming selection to select a step reference voltage among a plurality of programmable step reference voltages; and in response to setting the reference voltage programming selection:

generating a step reference voltage among the plurality of programmable step reference voltages based on a supply voltage and the reference voltage programming selection;

generating an input reference voltage based on the selected step reference voltage;

comparing the input reference voltage to an input circuit voltage from a measured circuit;

generating a digital measurement signal based on a difference between the input reference voltage and the input circuit voltage;

determining if the input reference voltage is greater than the input circuit voltage based on the digital measurement signal; and in response to the digital measurement signal indicating the input reference voltage is greater than the input circuit voltage:

(a) setting a next reference voltage programming selection to select a next step reference voltage among the plurality of programmable step reference voltages; and (b) in response to setting the next reference voltage programming selection:

(c) generating a next step reference voltage among the plurality of programmable step reference voltages based on the supply voltage and the next reference voltage programming selection;

(d) generating a next input reference voltage based on the selected next step reference voltage;

(e) comparing the next input reference voltage to the input circuit voltage from the measured circuit; and (f) generating a next digital measurement signal based on a difference between the next input reference voltage and the input circuit voltage.

20. The method of claim 19, further comprising:

determining if the next input reference voltage is greater than the input circuit voltage based on the next digital measurement signal; and in response to the next digital measurement signal indicating the next input reference voltage is greater than the input circuit voltage, iteratively perform steps (a)-(f) until the next input reference voltage is not greater than the input circuit voltage based on the next digital measurement signal.

21. The method of claim 19, further comprising:

generating a second step reference voltage among the plurality of programmable step reference voltages based on the supply voltage and the reference voltage programming selection; and generating the input reference voltage based on the selected step reference voltage and the second step reference voltage.

22. The method of claim 21, further comprising providing a selected step reference voltage among the step reference voltage and second step reference voltage as the input reference voltage, based on a received reference voltage selection.

23. The method of claim 22, further comprising:

generating a pulse width modulated (PWM) signal based on a received modulator input code indicating a duty cycle for the PWM signal; and interpolating the selected step reference voltage and the second step reference voltage based on the duty cycle of the PWM signal into the input reference voltage.

24. The method of claim 19, further comprising filtering out frequencies beyond a pass frequency in the input reference voltage.

25. The method of claim 21, wherein:

comparing the input reference voltage to the input circuit voltage from the measured circuit, comprises comparing a first input voltage on a first comparator input to a second input voltage on a second comparator input; and generating the digital measurement signal comprises generating the digital measurement signal based on a difference between the first input voltage and the second input voltage; and further comprising:

receiving the input reference voltage;

receiving the step reference voltage;

receiving the second step reference voltage;

receiving a positive input circuit voltage of the input circuit voltage;

receiving a negative input circuit voltage of the input circuit voltage;

receiving a mode selection indicating an operation mode;

coupling one of the input reference voltage, the step reference voltage, the second step reference voltage, the positive input circuit voltage, and the negative input circuit voltage to the first comparator input, based on the received mode selection; and coupling one of the input reference voltage, the step reference voltage, the second step reference voltage, the positive input circuit voltage, and the negative input circuit voltage to the second comparator input, based on the received mode selection.

26. The method of claim 25, wherein, in response to the mode selection indicating a single-ended voltage mode:

coupling the positive input circuit voltage to the first comparator input of a comparator circuit in a first clock cycle;

coupling the input reference voltage to the second comparator input of the comparator circuit in the first clock cycle;

coupling the input reference voltage to the first comparator input of the comparator circuit in a second clock cycle following the first clock cycle; and coupling the input circuit voltage to the second comparator input of the comparator circuit in the second clock cycle.

27. The method of claim 25, wherein, in response to the mode selection indicating a single-ended voltage mode:

coupling the positive input circuit voltage to the first comparator input of a comparator circuit in a first clock cycle;

coupling the negative input circuit voltage to the second comparator input of the comparator circuit in the first clock cycle;

coupling the input reference voltage to the first comparator input of the comparator circuit in a second clock cycle following the first clock cycle; and coupling a ground voltage to the second comparator input of the comparator circuit in the second clock cycle.

28. The method of claim 25, wherein, in response to the mode selection indicating a single-ended voltage mode:

coupling the second step reference voltage to the first comparator input of a comparator circuit in a first clock cycle;

coupling the input reference voltage to the second comparator input of the comparator circuit in the first clock cycle;

coupling the input reference voltage to the first comparator input of the comparator circuit in a second clock cycle following the first clock cycle; and coupling the second step reference voltage to the second comparator input of the comparator circuit in the second clock cycle.

29. The method of claim 25, wherein, in response to the mode selection indicating a single-ended voltage mode:

coupling the positive input circuit voltage to the first comparator input of a comparator circuit in a first clock cycle;

coupling the negative input circuit voltage to the second comparator input of the comparator circuit in the first clock cycle;

coupling the negative input circuit voltage to the first comparator input of the comparator circuit in a second clock cycle following the first clock cycle; and coupling the positive input circuit voltage to the second comparator input of the comparator circuit in the second clock cycle.

30. An analog calibration (ACAL) circuit, comprising:

a programmable voltage reference generation circuit configured to:

generate a step reference voltage among a plurality of programmable step reference voltages based on a supply voltage and a reference voltage programming selection selected by a reference voltage selection circuit;

the ACAL circuit configured to generate an input reference voltage based on the selected step reference voltage; and further comprising:

a comparator circuit configured to:

compare the input reference voltage to an input circuit voltage from a measured circuit; and generate a digital measurement signal based on a difference between the input reference voltage and the input circuit voltage; and a supply circuit configured to provide the supply voltage to the programmable voltage reference generation circuit, the supply circuit comprising:

a voltage supply circuit configured to couple a received supply voltage to the programmable voltage reference generation circuit in response to receiving a supply activation signal indicating a voltage supply selection; and a current supply circuit configured to couple a received supply current to the programmable voltage reference generation circuit in response to receiving the supply activation signal indicating a current supply selection.

31. The ACAL circuit of claim 30, further comprising a filter circuit coupled between the programmable voltage reference generation circuit and the comparator circuit;

the filter circuit configured to filter out frequencies beyond a pass frequency in the input reference voltage.

32. The ACAL circuit of claim 31, further comprising a filter circuit coupled to a reference voltage selection output of the reference voltage selection circuit and the comparator circuit;

the filter circuit configured to filter out frequencies beyond a pass frequency in the input reference voltage.

33. An analog calibration (ACAL) circuit, comprising:

a programmable voltage reference generation circuit configured to:

generate a step reference voltage among a plurality of programmable step reference voltages based on a supply voltage and a reference voltage programming selection selected by a reference voltage selection circuit;

the ACAL circuit configured to generate an input reference voltage based on the selected step reference voltage; and further comprising:

a comparator circuit configured to:

compare the input reference voltage to an input circuit voltage from a measured circuit; and generate a digital measurement signal based on a difference between the input reference voltage and the input circuit voltage; and a filter circuit coupled between the programmable voltage reference generation circuit and the comparator circuit;

the filter circuit configured to filter out frequencies beyond a pass frequency in the input reference voltage.

34. The ACAL circuit of claim 33, further comprising a filter circuit coupled to a reference voltage selection output of the reference voltage selection circuit and the comparator circuit;

the filter circuit configured to filter out frequencies beyond a pass frequency in the input reference voltage.

* * * * *